United States Patent
Tanaka et al.

(10) Patent No.: US 9,537,303 B2
(45) Date of Patent: Jan. 3, 2017

(54) SEMICONDUCTOR DEVICE AND ELECTRIC CONTROL DEVICE

(71) Applicant: Renesas Electronics Corporation, Kawasaki-shi (JP)

(72) Inventors: Makoto Tanaka, Tokyo (JP); Akihiro Nakahara, Kawasaki (JP)

(73) Assignee: RENESAS ELECTRONICS CORPORATION, Kawasaki-Shi, Kanagawa (JP)

( * ) Notice: Subject to any disclaimer, the term of this patent is extended or adjusted under 35 U.S.C. 154(b) by 215 days.

(21) Appl. No.: 14/137,791

(22) Filed: Dec. 20, 2013

(65) Prior Publication Data

US 2014/0184183 A1    Jul. 3, 2014

(30) Foreign Application Priority Data

Dec. 27, 2012  (JP) ................................ 2012-286088

(51) Int. Cl.
| | |
|---|---|
| G05F 1/00 | (2006.01) |
| H02H 9/02 | (2006.01) |
| H03K 17/082 | (2006.01) |

(52) U.S. Cl.
CPC .......... *H02H 9/025* (2013.01); *H03K 17/0822* (2013.01)

(58) Field of Classification Search
CPC ............ G05F 1/575; G05F 1/56; G05F 1/573; G05F 1/465; G05F 3/18; G05F 3/20; G05F 3/30; G05F 3/262; H03K 17/0822

USPC ....... 323/273–281, 311–317; 361/93.1, 93.7, 361/93.9; 327/538–543
See application file for complete search history.

(56) References Cited

U.S. PATENT DOCUMENTS

| | | | |
|---|---|---|---|
| 4,258,406 A | 3/1981 | Seki | |
| 2005/0013079 A1 | 1/2005 | Mitsuda | |
| 2007/0139839 A1 | 6/2007 | Yoshihara | |
| 2008/0002325 A1* | 1/2008 | Kato | ........................ H03K 3/00 361/101 |
| 2009/0128106 A1 | 5/2009 | Takahashi et al. | |
| 2010/0327828 A1 | 12/2010 | Lee et al. | |

FOREIGN PATENT DOCUMENTS

| | | |
|---|---|---|
| JP | 11-285146 A | 10/1999 |
| JP | 2005-039573 A | 2/2005 |
| JP | 2007-166444 A | 6/2007 |

OTHER PUBLICATIONS

European Search Report dated Mar. 25, 2014.
Japanese Office Action dated Jun. 14, 2016 with an English translation.

\* cited by examiner

*Primary Examiner* — Nguyen Tran
(74) *Attorney, Agent, or Firm* — McGinn IP Law Group, PLLC

(57) ABSTRACT

A semiconductor device includes: an output transistor; and a current detection section. The output transistor controls electric power supply from an electric power source to a load. The current detection section detects a current flowing through the output transistor. The current detection section has a current detection characteristic in which a current detection value has approximately linier and negative dependence on a drain-source voltage of the output transistor.

10 Claims, 19 Drawing Sheets

SEMICONDUCTOR DEVICE AND ELECTRIC CONTROL DEVICE

This application is based upon and claims the benefit of priority from Japanese patent application No. 2012-286088 filed on Dec. 27, 2012, the disclosure of which is incorporated herein in its entirety by reference.

TECHNICAL FIELD

The present invention relates to a semiconductor device and, for example, can be preferably applied to a semiconductor device used for a device supplying electric power to a load.

BACKGROUND ART

A power semiconductor device is known in which an electric power is supplied to a load by using an output transistor. For example, the power semiconductor device for a car is used to drive a load such as a lamp, a solenoid and the like. In the car, when a covering of a harness connecting the load is stripped and the harness is consequently brought into contact with a body (GND) of the car, this leads to a load short circuit situation, and an excessive electric power is applied to the output transistor. To protect the output transistor from having trouble caused by the foregoing load short circuit situation, the power semiconductor device includes an overcurrent protection circuit. One of the best known circuits as the overcurrent protection circuit is a current limit circuit. Under the overcurrent situation, the current limit circuit controls a gate voltage of the output transistor to carry out a feedback control such that a current flowing through the output transistor is kept at a constant value. As an example of the foregoing current limit circuit, a patent literature 1 (J P Heisei 11-285146A) discloses a protection circuit for a voltage-driven power semiconductor device.

The protection circuit for the voltage-driven power semiconductor device in the patent literature 1 includes an output current monitor means, an overcurrent protection means and an output current limit means. The output current monitor means monitors an output current of the voltage-driven power semiconductor device. The overcurrent protection means tries to protect the output current from exceeding a predetermined value by adjusting a gate potential of the voltage-driven power semiconductor device, based on a current value monitored by the output current monitor means, when the output current of the voltage-driven power semiconductor device exceeds the predetermined value. The output current limit means limits the output current based on a voltage that is applied between both ends of the voltage-driven power semiconductor device. In this current limit circuit, mainly, a current limit value is changed like stairs based on a voltage between a drain and a source of the output transistor (FIG. 2 of the patent literature 1). The current limit value may be linearly changed in a certain range (FIG. 6 and FIG. 12 of the patent literature 1).

CITATION LIST

Patent Literature

[PTL 1] J P Heisei 11-285146A

The inventors have now discovered the following facts. When the load characteristic is a resistive characteristic, a load line of the voltage and the current under the load short circuit becomes linear. Therefore, even if the current limit value is changed like stairs as the patent literature 1, the current reaches the current limit value at the time when the current is low (the voltage between a drain and a source is high). As a result, the current flowing through the output transistor can be limited to the low value. However, an actual device includes inductance components of a power wiring line and a load wiring line. That is, since the load characteristic includes an inductive characteristic, the load line of the voltage and the current under the load short circuit becomes non-linear. Therefore, when the current limit value is changed like stairs as the patent literature 1, the load line goes around to the lower side of the stairs and reaches the current limit value at the time when the current is high (the voltage between the drain and the source is low). Consequently, the current flowing through the output transistor becomes high and cannot be limited to the low value even though the current is limited to the current limit value. Therefore, there is concern that a high electric power is applied to the output transistor.

Other objects and new features of the present invention will be apparent from the following descriptions and the accompanying drawings.

SUMMARY OF THE INVENTION

According to an embodiment, a semiconductor device has a current detection characteristic in which a current detection value (a current limit value) has approximately-linear and negative dependence on a voltage between a drain and a source of an output transistor.

According to the embodiment, an appropriate protection function against an overcurrent can be provided.

BRIEF DESCRIPTION OF THE DRAWINGS

FIG. 1 is a block diagram showing a configuration example of a semiconductor device according to an embodiment;

FIG. 13 is a block diagram showing a configuration example of a semiconductor device according to a second embodiment;

FIG. 15 is a block diagram showing a configuration example of a semiconductor device according to a fourth embodiment;

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

A semiconductor device and an electronic control device according to the embodiments will be described below.

(First Embodiment)

Figure 1:
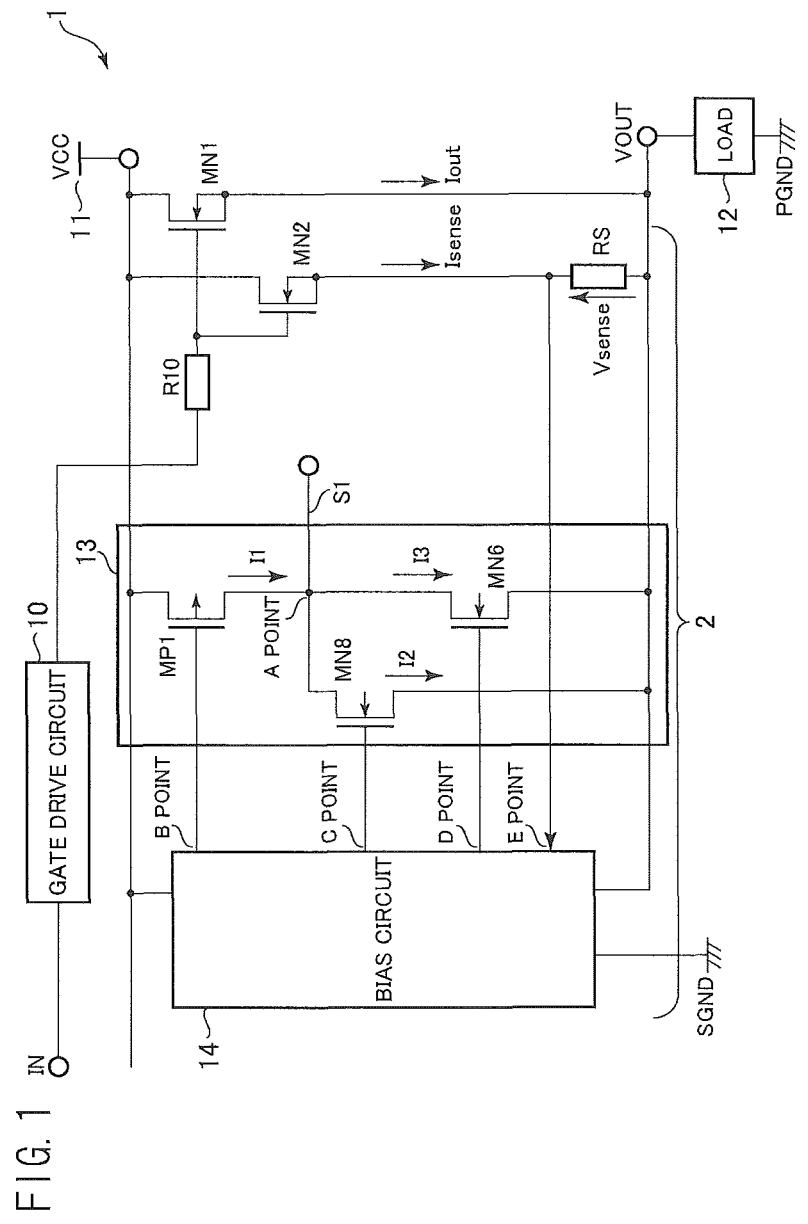

A configuration of the semiconductor device according to the first embodiment will be described with reference to attached drawings. FIG. 1 is a block diagram showing a configuration example of the semiconductor device according to the present embodiment.

A semiconductor device 1 according to the present embodiment includes an output transistor MN1 and a current detection section 2. The output transistor MN1 controls electric power supply from an electric power source 11 to a load 12. The current detection section 2 detects a current flowing through the output transistor MN1. The current detection section 2 has a current detection characteristic (current limit characteristic) in which a current detection value has approximately-linear and negative dependence on a voltage between a drain and a source of the output transistor MN1. Here, the current detection value is an upper limit current value (the current limit value) of an output current Iout of the output transistor MN1. In other words, the current detection section 2 detects whether or not the output current Iout reaches the upper limit current value. The upper limit current value has the approximately-linear and negative dependence on the voltage between the drain and the source of the output transistor MN1.

Figure 2:
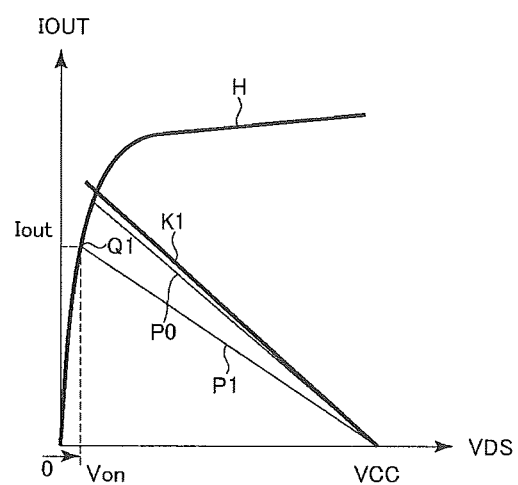
FIG. 2 is a graph showing a relation between an output transistor and a current detection value according to the embodiment.

FIG. 2 is a graph showing a relation between the output transistor and the current detection value according to the present embodiment. A vertical axis indicates a current IOUT (also indicates an output current) flowing through the output transistor MN1. A horizontal axis indicates a voltage VDS between the drain and the source of the output transistor MN1, and a source voltage (a voltage of a terminal VOUT in this case) of the output transistor MN1 is used as a reference. As respective curves, a voltage-current characteristic H of the output transistor MN1, a load line P1 at a normal time, and a current detection value K1 according to the present embodiment are indicated respectively. In a normal operation, an intersection point of the load line P1 and the voltage-current characteristic H serves as an operating point Q1.

As shown in the figure, in the semiconductor device 1 of the present embodiment, the characteristic of the current detection value K1 is not a characteristic having a stair-like pattern as described in the patent literature 1 but a characteristic having the approximately-linear and negative dependence on a voltage Von (VDS) between the drain and the source of the output transistor MN1. In other words, the characteristic of the current detection value K1 (the characteristic of the current limit value) has the approximately-linear and negative dependence similar to the load line P1 on which the load can be normally driven. When suitable protection and effective use of the output transistor MN1 are considered, this current detection characteristic (current limit characteristic) is preferred to be along the maximum load line P0 (the load line in the case of the minimum load) among load lines at which the load can be normally driven. The minimum load implies the load that the current flowing through the output transistor MN1 becomes the maximum current among allowable currents for the output transistor MN1. When the load is normally driven, it is set such that the operating point is located inside the linear region of the output transistor MN1. The current detection value K1 is set to have the current characteristic higher by a predetermined current value than the current characteristic of the maximum load line P0.

When this current detection value K1 is formulated, the following equation (1) is established from FIG. 1 and FIG. 2.

$$\alpha \cdot Isense + Von = VCC$$

$$n \cdot Isense = Iout$$

$$Isense = -(1/\alpha) \cdot Von + (1/\alpha) \cdot VCC \tag{1}$$

Here, the respective symbols are as follows. The Iout is a drain current of the output transistor MN1, the VCC is an electric power source voltage, the Von is the voltage between the drain and the source of the output transistor MN1, the Isense is a sense current proportional to the output current Iout of the output transistor MN1, and the $\alpha$ is a proportional constant (a gradient of the current detection value). A sense ratio between the output current Iout and the sense current Isense is n. Here, the equation (1) is represented by using the equation of the sense current Isense because the sense current Isense is used to detect the output current Iout. By using the current depending on the Isense, the current depending on the Von and the current depending on the VCC, it is possible to obtain the current detection value K1 (=the limit value of Iout) that satisfies this equation (1). At this time, in the equation (1), if the Isense=(the right side) is satisfied, this case can be judged to be an overcurrent, and if Isense<(the right side) is satisfied, this case can be judged not to be the overcurrent. Incidentally, a setting method of the current detection value K1 will be described later.

The effect of the semiconductor device of the present embodiment will be described by comparing with the patent literature 1.

Figure 3A:
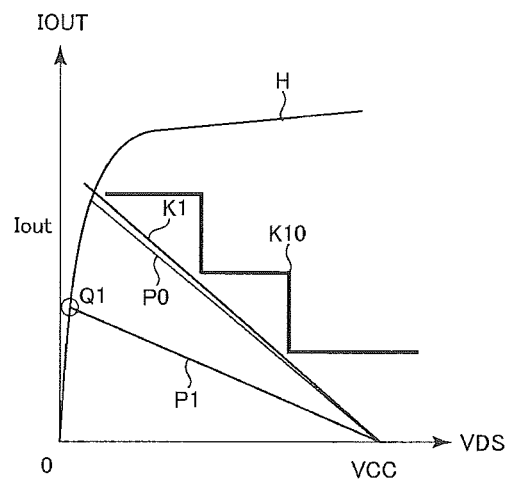
FIG. 3A is a graph showing a current limit method in the patent literature 1.
Figure 3B:
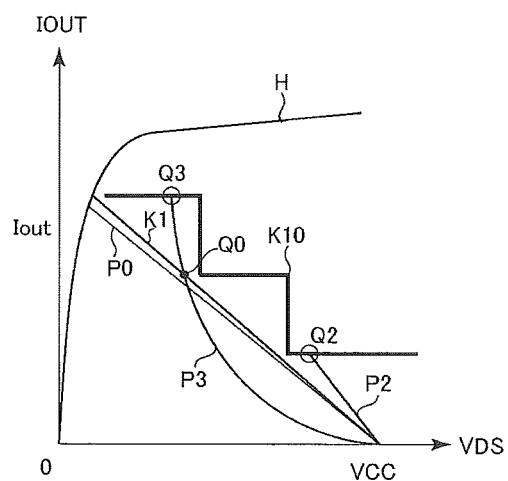
FIG. 3B is a graph showing a current limit method in the patent literature 1.

FIG. 3A and FIG. 3B are graphs showing a current limit method in the patent literature 1. In FIGS. 3A and 3B, a vertical axis indicates the (drain) current IOUT (the output current) flowing through the output transistor, and a horizontal axis indicates the voltage VDS between the drain and the source of the output transistor. FIGS. 3A and 3B indicate, as respective curves, the voltage-current characteristic H of the output transistor, the load line P1 at the normal time, a current detection value K10 of the patent literature 1, a load line P2 (resistive characteristic) at a time of a load short circuit, a load line P3 (inductive characteristic) at a time of a load short circuit, and the current detection value K1 of the present embodiment. In the normal operation, the intersection point of the load line P1 and the voltage-current characteristic H serves as the operating point Q1.

As shown in FIG. 3A, the current detection value K1 of the present embodiment is set, for example, along the maximum load line P0 at which the load can be normally driven. Thus, the current detection value K1 of the present embodiment exhibits a downward-sloping straight line, similar to the normal load lines P0 and P1, although its slop is different. On the other hand, the current limit value K10 of the patent literature 1 is relatively large in current value as compared with the current detection value K1 of the present embodiment and is set as the stair-like pattern. As a result, the patent literature 1 has the problems as described below.

As shown in FIG. 3B, when the load line of the voltage-current when the load short circuit is resistive (the load line P2), by using the current detection value K10 that is changed like stairs, the overcurrent is detected at an operating point Q2 in which the current is low. On the contrary, by using the current detection value K1 of the present embodiment, the current exceeds the current detection value K1 at the time when the load current begins to flow (namely, at the time when the VDS becomes slightly lower than the VCC). Thus, even at the time when the current value is lower than the current detection value K10, the overcurrent can be detected. Hence, according to the current detection value K1 of the present embodiment, the current flowing through the output transistor can be limited to a low value, at the time of the load short circuit.

When the load line of the voltage-current when the load short circuit is inductive, there is a case that a load line is curved such as the load line P3 shown in FIG. 3B. At that time, in the current detection value K10 that is changed like stairs, the load line P3 goes around to the lower side of the stairs, and the overcurrent is detected at an operating point Q3 in which the current is high. Thus, at the time of the load short circuit, the current flowing through the output transistor is increased to the current value of the operating point Q3. For this reason, there is concern that a high electric power is applied to the output transistor.

On the contrary, in the semiconductor device 1 of the present embodiment, the current detection value (current limit value) K1 is set along the maximum load line P0 in which the load can be normally driven, for example, as shown in FIG. 3A. For this reason, the overcurrent is detected at an operating point Q0 in which the load line P3 intersects the current detection value K1. In short, by using the current detection value K1, the current value of the operating point Q0 at which the overcurrent is detected can be set lower than the current value of the operating point Q3 at which the overcurrent is detected based on the current detection value K10 of the stair-like pattern. The current detection value K1 of the present embodiment is set along the maximum load line P0. Thus, the electric power applied to the output transistor can be suppressed to a requisite minimum value.

The semiconductor device 1 of the present embodiment will be described below in detail.

As shown in FIG. 1, the semiconductor device 1 includes the output transistor MN1 and the current detection section 2. The current detection section 2 includes a sense transistor MN2, a sense resistor RS, a gate resistor R10, a gate drive circuit 10, a comparison circuit 13 and a bias circuit 14.

The output transistor MN1 makes the output current Iout flow through an output terminal to the load 12. The sense transistor MN2 converts the output current Iout, which flows through the output transistor MN1, into a very small current Isense and observes it. The output transistor MN1 and the sense transistor MN2 are, for example, N-channel transistors. In the output transistor MN1 and the sense transistor MN2, commonly, their drains are connected to each other, and their gates are connected to each other. Their common drains are connected to the electric power source 11 (VCC). Their common gates are connected through the gate resistor R10 to the output side of the gate drive circuit 10. A source of the output transistor MN1 is connected to the terminal VOUT. A source of the sense transistor MN2 is connected to one end of the sense resistor RS. The sense resistor RS converts the current Isense, which is observed by the sense transistor MN2, into a voltage Vsense. The other end of the sense resistor RS is connected to the terminal VOUT. That is, the source of the sense transistor MN2 is connected through the sense resistor RS to the terminal VOUT.

The gate resistor R10 is the resistor, which is placed between the output side of the gate drive circuit 10 and the gates of the output transistor MN1 and the sense transistor MN2. In the gate drive circuit 10, its input side is connected to an input terminal IN, and its output side is connected through the gate resistor R10 to the gates of the output transistor MN1 and the sense transistor MN2. The gate drive circuit 10 drives the gates of the output transistor MN1 and the sense transistor MN2, on the basis of an input signal VIN.

The comparison circuit 13 outputs a current detection signal S1, which indicates whether or not the current flowing through the output transistor MN1 is the overcurrent, to an A point. The comparison circuit 13 includes a P-channel transistor MP1, an N-channel transistor MN8 and an N-channel transistor MN6. A gate of the P-channel transistor MP1 receives a signal of a B point of the bias circuit 14. A gate of the N-channel transistor MN8 receives a signal of a C point of the bias circuit 14. A gate of the N-channel transistor MN6 receives a signal of a D point of the bias circuit 14. The P-channel transistor MP1 is connected between the electric power source 11 (VCC) and the A point. Each of the N-channel transistors MN8 and MN6 is connected between the A point and the terminal VOUT.

The bias circuit 14 supplies gate voltages to the P-channel transistor MP1, the N-channel transistor MN8 and the N-channel transistor MN6 in the comparison circuit 13. The bias circuit 14 is placed between the electric power source 11 (VCC), GND (SGND) for an inner circuit in the semiconductor device 1 and the terminal VOUT. A bias voltage depending on an electric power source voltage VCC is outputted to the B point of the bias circuit 14. A bias voltage depending on the current of the output transistor MN1 is outputted to the C point. A bias voltage depending on the voltage between the drain and the source of the output transistor MN1 is outputted to the D point. In order to apply the bias voltage depending on the current of the output transistor MN1 to the C point, the voltage Vsense of the sense resistor RS is inputted to an E point.

Consequently, a current I1 depending on the electric power source voltage VCC flows through the P-channel transistor MP1. A current I2 depending on the output current Iout of the output transistor MN1 flows through the N-channel transistor MN8. A current I3 depending on the voltage between the drain and the source of the output transistor MN1 flows through the N-channel transistor MN6. In other words, the current I1 corresponds to the $(1/\alpha) \cdot VCC$ in the equation (1). The current I2 corresponds to the Isense in the equation (1) because the current I2 can be regarded as the current depending on the current Isense. The current I3 corresponds to the $(1/\alpha) \cdot Von$ in the equation (1). Thus, as described later, a fact that the A point is biased to become I1>(I2+I3) can be judged that the Isense is small with respect to an allowable current value $(1/\alpha) \cdot (VCC-Von)$ at a voltage of (VCC−Von), namely, the case of Isense<(the right side) in the equation (1). Thus, the case can be judged that the overcurrent does not occur. On the other hand, a fact that the A point is biased to become I1<(I2+I3) can be judged that the Isense is great with respect to the allowable current value $(1/\alpha) \cdot (VCC-Von)$ at a voltage of (VCC−Von), namely, the case of Isense>(the right side) in the equation (1). Thus, the case can be judged that the overcurrent occurs. In this way, by comparing a magnitude relation between the current I1 and the current (I2+I3), the comparison circuit 13 can output a current detection signal of an H level (normal current case) or L level (overcurrent detection case) to the A point.

The load 12 is connected between the terminal VOUT and GND (PGND) for a load. In this case, the semiconductor device 1 is connected to a high side of the load 12.

An operating method of the semiconductor device 1 according to the present embodiment will be described below.

When the input terminal IN is changed from the L level to the H level, the gate drive circuit 10 outputs a voltage higher than the electric power source voltage VCC and turns on the output transistor MN1 and the sense transistor MN2 to makes the current flow into the load 12. Then, the output current Iout flows through the output transistor MN1 and the current Isense flows through the sense transistor MN2.

At first, the normal load case is considered. When the load is normal, the voltage of the terminal VOUT is the voltage extremely close to the electric power source voltage VCC. The voltage is the voltage of VCC−Ron·Iout. Here, the Ron is an on resistance of the output transistor MN1 and an extremely small value, for example, 10 mΩ. At this time, the output current Iout of the output transistor MN1 is smaller than the current detection value K1. Thus, the voltage of the E point (=the voltage Vsense of the sense resistor RS) becomes small and the bias voltage of the C point becomes small. Also, since the voltage Von between the drain and the source of the output transistor MN1 is small, the bias voltage of the D point is small. Thus, each of the transistors of the comparison circuit 13 is biased so as to be I1>(I2+I3). At the A point, I1=I2+I3 must be always established in accordance with the Kirchhoff's current law. For this reason, the voltage of the A point is increased such that the current I1 of the P-channel transistor MP1 is balanced with the current (I2+I3), and the P-channel transistor MP1 is operated in a linear region. With those operations, the H level signal is outputted to the A point. The signal of the H level of the A point indicates that the load is normal.

Next, an abnormal load case is considered. For example, when the semiconductor device 1 is used for a car, the load abnormality occurs because a covering of a harness connecting the load is stripped and the harness is consequently brought into contact with a body (GND) of a car. That is, the load short circuit occurs. When the foregoing load short circuit occurs, the terminal VOUT is connected to the GND. Thus, a great voltage is applied between the drain and the source of the output transistor MN1. That is, the Von is made great.

When the load short circuit occurs, with an increase in the output current Iout flowing through the output transistor MN1, the current Isense flowing through the sense transistor MN2 is increased, which leads to an increase in the sense voltage Vsense in the E point. Consequently, since the voltage of the E point (=the voltage Vsense of the sense resistor RS) is increased, the bias voltage of the C point is increased. Also, since the voltage Von between the drain and the source of the output transistor MN1 is high, the bias voltage of the D point is made high. For this reason, the currents I2 and I3 are increased. Thus, each of the transistors in the comparison circuit 13 is biased so as to be I1<(I2+I3). At the A point, I1=I2+I3 must be always established in accordance with the Kirchhoff's current law. For this reason, the voltage of the A point is decreased such that the current (I2+I3) is balanced with the current I1, and the N-channel transistors MN6 and MN8 are operated in the linear region. With those operations, the L level signal, namely, the overcurrent detection signal is outputted to the A point. The signal of the L level of the A point indicates that the load is abnormal.

As mentioned above, the semiconductor device 1 according to the present embodiment is operated.

As a result, the presence or absence of the abnormality of the load can be judged on the basis of the voltage level of the A point. Then, by outputting the overcurrent detection signal of the A point to, for example, another control circuit, the other control circuit can control the gate of the output transistor MN1 through the gate drive circuit 10. Thus, the electric power supply to the load 12 can be limited or interrupted. Hence, the semiconductor device can be protected from the overcurrent.

Figure 4:
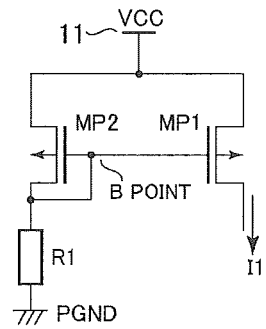
FIG. 4 is a circuit diagram showing an example of a configuration of a bias circuit and a comparison circuit in the semiconductor device according to the embodiment.
Figure 5:
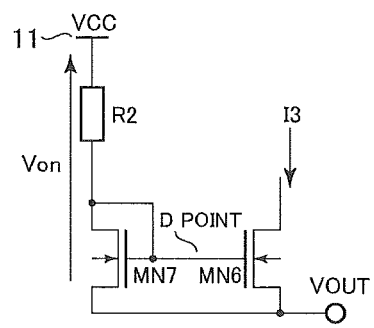
FIG. 5 is a circuit diagram showing an example of a configuration of a bias circuit and a comparison circuit in the semiconductor device according to the embodiment.
Figure 6:
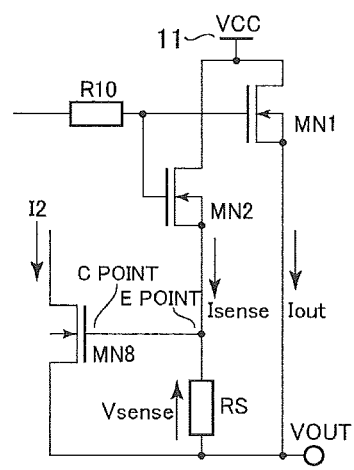
FIG. 6 is a circuit diagram showing an example of a configuration of a bias circuit and a comparison circuit in the semiconductor device according to the embodiment.

FIG. 4 to FIG. 6 are circuit diagrams showing an example of configurations of the bias circuit 14 and the comparison circuit 13 in the semiconductor device according to the present embodiment. Here, FIG. 4 shows an example of a circuit configuration for generating the current I1 depending on the electric power source voltage VCC. FIG. 5 shows an example of a circuit configuration for generating the current I3 depending on the Von. FIG. 6 shows an example of a circuit configuration for generating the current I2 depending on the output current Iout of the output transistor MN1.

In FIG. 4, the P-channel transistor MP1 and the P-channel transistor MP2 are connected in a current mirror manner. A gate and a drain of the P-channel transistor MP2 are connected through a resistor R1 to the GND (the SGND serving as the GND for the circuit). Specifically, the sources of the P-channel transistor MP1 and the P-channel transistor MP2 are connected to the electric power source 11 (VCC). The gates of the P-channel transistor MP1 and the P-channel transistor MP2 are connected to the drain of the P-channel transistor MP2. The drain of the P-channel transistor MP2 is connected to one end of the resistor R1. The other end of the resistor R1 is connected to the SGND.

A current flowing through the resistor R1 flows through the P-channel transistor MP2. As the electric power source voltage VCC becomes higher, the voltage between both ends of the resistor R1 becomes higher, and the current flowing through the resistor R1 is increased. On the other hand, as the electric power source voltage VCC becomes lower, the voltage between both ends of the resistor R1 becomes lower, and the current flowing through the resistor R1 is decreased. In this way, in the circuit of FIG. 4, the current depending on the electric power source voltage VCC flows through the P-channel transistor MP2. Since the P-channel transistor MP1 and the P-channel transistor MP2 are connected in the current mirror manner, the same current as the P-channel transistor MP2 can be made to flow through the P-channel transistor MP1. Thus, The circuit in FIG. 4 can supply the current I1 depending on the electric power source voltage VCC into the A point. The current I1 becomes the current proportional to the electric power source voltage VCC.

In FIG. 5, an N-channel transistor MN6 and an N-channel transistor MN7 are connected in a current mirror manner. Then, a gate and a drain of the N-channel transistor MN7 are connected through a resistor R2 to the electric power source 11 (VCC). Specifically, the sources of the N-channel transistor MN6 and the N-channel transistor MN7 are connected to the terminal VOUT. The gates of the N-channel transistor MN6 and the N-channel transistor MN7 are connected to a drain of the N-channel transistor MN7. The drain of the N-channel transistor MN7 is connected to one end of the resistor R2. The other end of the resistor R2 is connected to the electric power source 11 (VCC).

A current flowing through the resistor R2 flows through the N-channel transistor MN7. As the Von (=the voltage between the electric power source 11 (VCC) and the terminal VOUT) becomes higher, the voltage between both ends of the resistor R2 becomes higher, and the current flowing through the resistor R2 is increased. On the other hand, as the Von becomes lower, the voltage between both ends of the resistor R2 becomes lower, and the current flowing through the resistor R2 is decreased. In this way, in the circuit of FIG. 5, the current depending on the Von flows through the N-channel transistor MN7. Since the N-channel transistor MN6 and the N-channel transistor MN7 are connected in the current mirror manner, the same current as the N-channel transistor MN7 can be made to flow through the N-channel transistor MN6. Thus, the circuit in FIG. 5 can pull out the current I3 depending on the Von from the A point. The current I3 becomes the current proportional to the Von.

In FIG. 6, the drains of the output transistor MN1 and the sense transistor MN2 are commonly connected to the electric power source 11 (VCC). The gates of the output transistor MN1 and the sense transistor MN2 are commonly connected to each other. The source of the output transistor MN1 is connected to the terminal VOUT. The source of the sense transistor MN2 is connected to one end (E point) of the sense resistor RS. The other end of the sense resistor RS is connected to the terminal VOUT. In the N-channel transistor MN8, its source is connected to the terminal VOUT, and its gate is connected to the E point.

As the Von of the output transistor MN1 (=the voltage between the electric power source 11 (VCC) and the terminal VOUT) becomes high and the output current Iout is increased, the current Isense flowing through the sense transistor MN2 is also increased, which leads to the increase between both ends of the sense resistor RS. Consequently, the voltage between the gate and the source of the N-channel transistor MN8 is increased, and the current I2 is increased. On the other hand, when the output current Iout is decreased, the current Isense flowing through the sense transistor MN2 is also decreased, and the voltage between both ends of the resistor RS is decreased. Consequently, the voltage between the gate and the source of the N-channel transistor MN8 is decreased, and the current I2 is decreased. In this way, in the circuit in FIG. 6, the N-channel transistor MN8 is controlled, depending on the output current Iout of the output transistor MN1. For this reason, the N-channel transistor MN8 can pull out the current I2 depending on the Iout (namely, n×Isense) from the A point.

Figure 7:
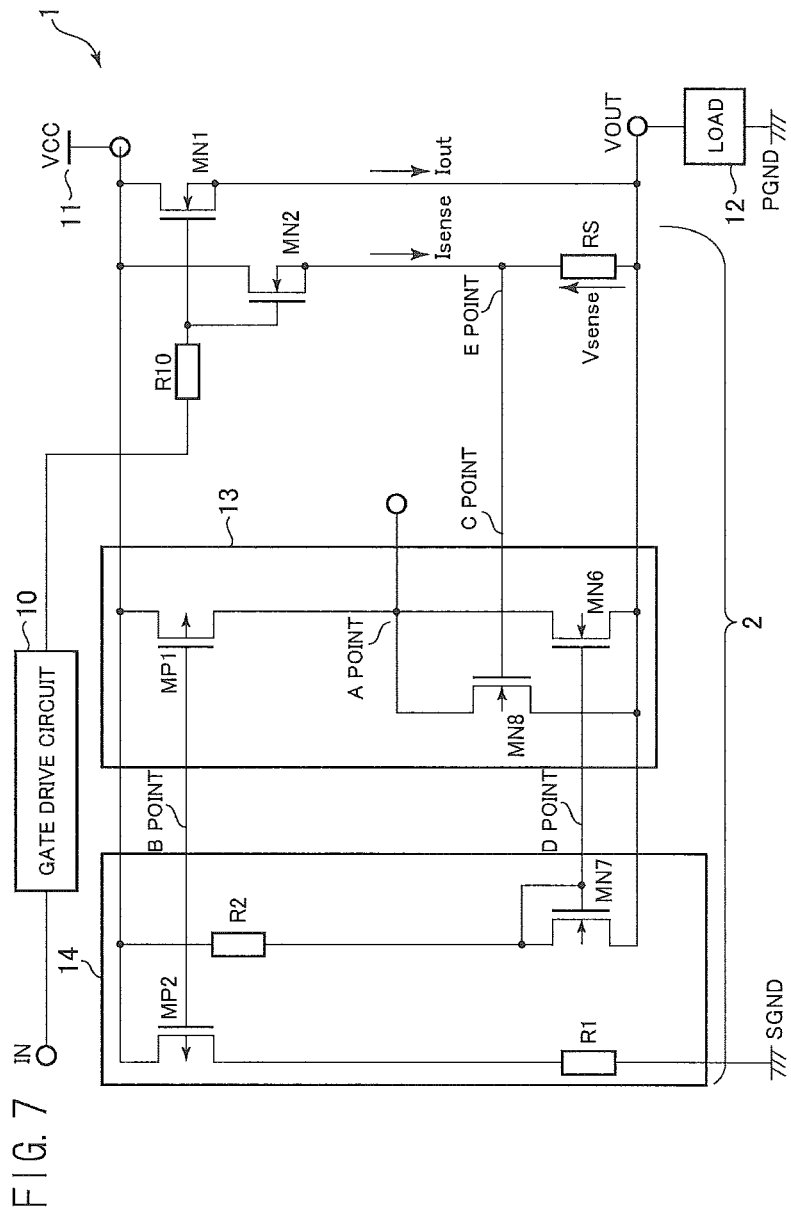
FIG. 7 is a circuit diagram showing an example of a configuration in which the circuits of FIG. 4 to FIG. 6 are installed in the semiconductor device according to the embodiment.

FIG. 7 is a circuit diagram showing an example of a configuration in which the circuits of FIG. 4 to FIG. 6 are installed in the semiconductor device according to the present embodiment. As shown in FIG. 7, the circuits of FIG. 4 to FIG. 6 can be combined to configure the bias circuit 14 and the comparison circuit 13.

As mentioned above, the semiconductor device 1 according to the present embodiment can be operated such that the sum of the currents at the A point approximately satisfies the equation (1) by using the comparison circuit 13 shown in FIG. 1 or FIG. 7 without depending on the load state. That is, at the A point of the comparison circuit 13, the Kirchhoff's current law is applied, and while the current I1=I2+I3 is always satisfied, the H level/L level of the signal of the A point is determined on the basis of the electric power source voltage VCC, the voltage Von between the drain and the source, and the output current Iout (the sense current Isense). In other words, a boundary between the H level and the L level of the signal of the A point is the current detection value K1 in FIG. 2.

Figure 8:
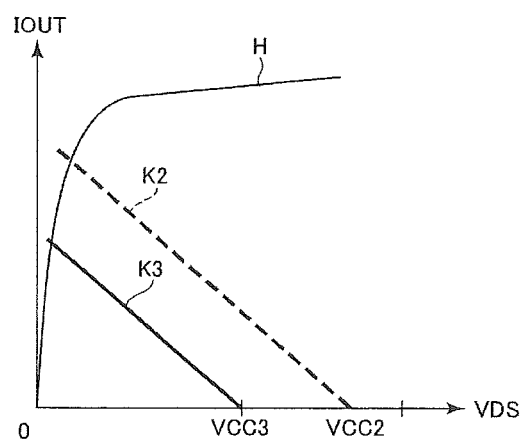
FIG. 8 is a graph showing a relation between a current detection value and an electric power source voltage in the semiconductor device according to the embodiment.

At this time, the current detection value K1 is determined by the equation (1). Thus, when the electric power source voltage VCC is changed, the current detection value K1 is also changed. FIG. 8 is a graph showing a relation between the current detection value and the electric power source voltage in the semiconductor device according to the present embodiment. A vertical axis indicates the (drain) current IOUT flowing through the output transistor MN1, and a horizontal axis indicates the voltage VDS between the drain and the source of the output transistor MN1. It is assumed that an electric power source voltage VCC2>an electric power source voltage VCC3. In this case, from the equation (1), when the electric power source voltage is decreased from VCC2 to VCC3, the current detection value (current limit value) is also shifted to a low voltage side, namely, from K2 to K3. In contrast, when the electric power source voltage is increased, the current detection value (current limit value) is also shifted to a high voltage side. In this way, in the semiconductor device 1, the current detection value is determined in accordance with the equation (1). Thus, the current detection value having dependency with respect to the electric power source voltage VCC is obtained. Consequently, even if the electric power source voltage VCC is changed and a high voltage is applied as the electric power source voltage VCC, accordingly, the current detection value is changed. Hence, the output transistor MN1 can be controlled correspondingly to even the change in the electric power source voltage VCC.

An example of a setting method of a current detection value K in the semiconductor device according to the present embodiment will be described below.

Figure 9:
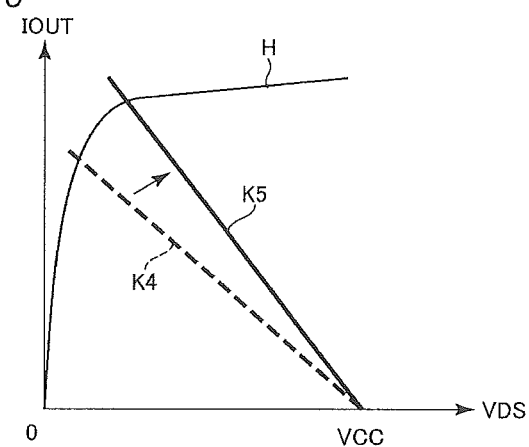
FIG. 9 is a graph showing an example of a setting method of the current detection value in the semiconductor device according to the embodiment.
Figure 10:
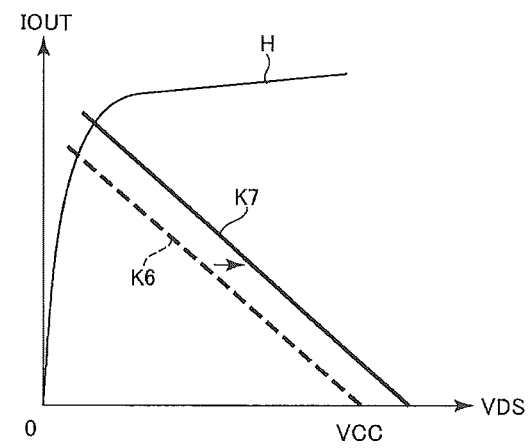
FIG. 10 is a graph showing another example of the setting method of the current detection value in the semiconductor device according to the embodiment.

FIG. 9 and FIG. 10 are graphs showing the examples of the setting method of the current detection value in the semiconductor device according to the present embodiment. A vertical axis indicates the current IOUT flowing through the output transistor MN1. A horizontal axis indicates the voltage VDS between the drain and the source of the output transistor MN1. As the respective curves, the voltage-current characteristic H of the output transistor MN1 and a current detection value K4 to a current detection value K7 are respectively shown. Those graphs show a method of changing the current detection value.

A gradient of the current detection value can be changed depending on the resistive value of the sense resistor RS. For example, as shown in FIG. 9, when the resistive value of the sense resistor RS is made small, a gradient of the current detection value K4 can be changed to a sharp gradient such as K5.

Also, the graph of the current detection value can be changed depending on the value of the resistor R1 which detects the change in the electric power source voltage VCC. For example, as shown in FIG. 10, with regard to a position of the current detection value K6, when the resistive value of the resistor R1 (the resistor in the bias circuit (FIG. 4) to generate the current depending on the electric power source voltage VCC) is made small, the current I1 depending on the electric power source voltage VCC can be increased, thereby shifting a horizontal-axis intercept of the current detection value to a right side (high voltage side) such as K7.

Figure 11:
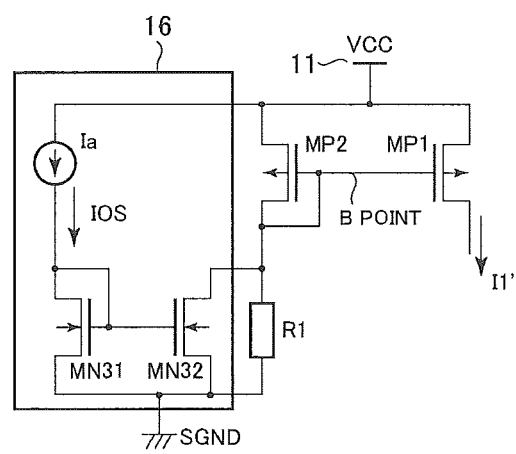
FIG. 11 is a graph showing still another example of the setting method of the current detection value in the semiconductor device according to the embodiment.
Figure 12:
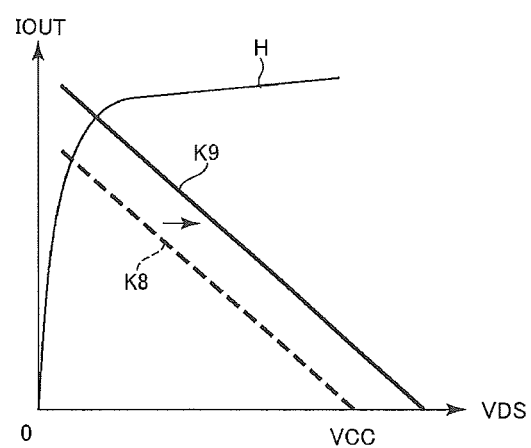
FIG. 12 is a graph showing still another example of the setting method of the current detection value in the semiconductor device according to the embodiment.

FIG. 11 and FIG. 12 are a circuit diagram and a graph, which show another example of the setting method of the current detection value in the semiconductor device according to the present embodiment. Here, in FIG. 12, a vertical axis indicates the current IOUT flowing through the output transistor MN1. A horizontal axis indicates the voltage VDS between the drain and the source of the output transistor MN1. As the respective curves, the voltage-current characteristic H of the output transistor MN1, a current detection value K8 and a current detection value K9 are respectively shown. Those circuit diagram and graph show another method of changing the horizontal-axis intercept of the current detection value.

In FIG. 11, a circuit for generating a current I1' depending on this electric power source voltage VCC has a configuration in which a current IOS is added by a current mirror circuit 16 to the current determined by the resistor R1 in FIG. 4. In FIG. 11, the elements having the same symbols as FIG. 4 represent the same elements and their explanations are omitted.

The current mirror circuit 16 includes an N-channel transistor MN31, an N-channel transistor MN32 and a current source Ia. A source, a drain and a gate of the N-channel transistor MN31 are connected to the SGND, one end of the current source Ia and one end of the current source Ia, respectively. A source, a drain and a gate of the N-channel transistor MN32 are connected to the SGND, the B point, and the gate of the N-channel transistor MN31, respectively.

In the current mirror circuit 16, the current IOS of the current source 1a flows through the N-channel transistor MN31. This current is mirrored (copied) in the N-channel transistor MN32 through the current mirror connection between the N-channel transistor MN31 and the N-channel transistor MN32. When the size of the N-channel transistor MN31 is equal to the size of the N-channel transistor MN32, the same current as the N-channel transistor MN31 flows through the N-channel transistor MN32. This current is added to the current flowing through the resistor R1 at one end of the resistor R1 (the B point). That is, the sum of the current flowing through the resistor R1 and the current flowing through the N-channel transistor MN32 in the current mirror circuit 16 flows through the P-channel transistor MP2. As a result, the horizontal-axis intercept of the current detection characteristic can be changed as shown in FIG. 12. In FIG. 12, the current detection value K8 indicates a case that there is not the current mirror circuit 16 and the current detection value K9 indicates a case that there is the current mirror circuit 16, respectively. In this way, by adding the current mirror circuit 16 to increase the current flowing through the P-channel transistor MP2, the current I1' flowing through the P-channel transistor MP1 is increased, thereby enabling to increase the horizontal-axis intercept of the current detection value.

As mentioned above, with regard to the current detection value K, by changing a relative value of an element used in the current detection section 2 and/or changing a current value to be supplied, an desirable current detection characteristic (e.g. a gradient and a horizontal-axis intercept) can be obtained. Consequently, on the basis of the characteristic of the load, it is possible to flexibly change the characteristic of the overcurrent protection of the semiconductor device.

As mentioned above, in the semiconductor device 1 of the present embodiment, by introducing the comparison circuit 13 that detects the current while enabling the current I1, the current I2 and the current I3 to satisfy I1=I2+I3 (namely, the equation (1)), it is possible to obtain the linear current detection value. Here, the current I1 depends on the electric power source voltage VCC. The current I2 depends on the voltage Von between the drain and the source of the output transistor MN1. The current I3 depends on the sense current Isense (namely, the output current Iout flowing through the output transistor MN1).

Also, in the semiconductor device 1 of the present embodiment, the current detection value can be set to a linear value along the load line. For this reason, there is not any operating point at which the current becomes high beyond expectation, when the load is abnormal. Thus, the excessive current never flows through the output transistor MN1, and a thermal stress caused by Joule heat can be suppressed to a small value.

Typically, in the field of the car, the GND (PGND) of the load and the GND (SGND) of the circuit are provided at different places; For this reason, there may be a case that the maximum potential difference of about ±2 V is generated between both GNDs. In such an environment, there is a possibility that a potential of the terminal VOUT becomes lower than the SGND. However, even if such an event occurs, in the semiconductor device 1 of the present embodiment, since the comparison circuit 13 is configured between the electric power source 11 (VCC) and the output terminal VOUT, it is possible to carry out the foregoing current detection even in a circumstance of VOUT<SGND.

In the method in which the current detection value is set in the stair-like pattern as described in the patent literature 1, in order to make the current detection value close to a linear style, detection functions with many stages are required, which results in a large circuit scale. However, in the semiconductor device 1 in the present embodiment, even in the small circuit scale, it is possible to obtain the ideal current detection value (linear current detection value) that follows the changes in the VCC, the Von and the Isense.

(Second Embodiment)

A configuration of a semiconductor device 1*a* according to the second embodiment will be described below with reference to the attached drawings. The semiconductor device 1*a* of the present embodiment differs from the semiconductor device 1 of the first embodiment in that the level of the output signal of the A point (the presence or absence of the overcurrent) is fed back and the gate of the output transistor MN1 is controlled such that the output current Iout does not become an overcurrent. Hereafter, the difference from the first embodiment will be mainly described.

Figure 13:
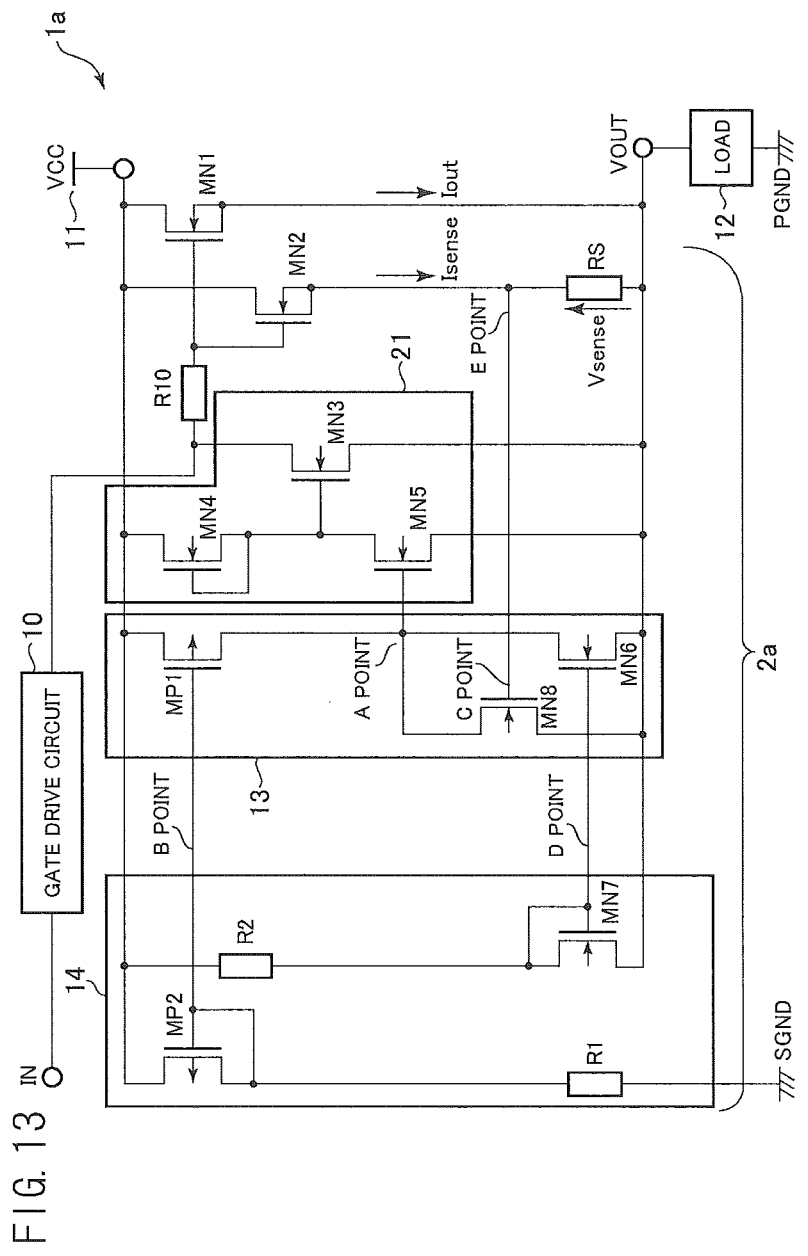

FIG. 13 is a block diagram showing a configuration example of the semiconductor device according to the present embodiment. In this figure, as the bias circuit 14 and the comparison circuit 13 shown in FIG. 1, those shown in FIG. 4 to FIG. 6 are used. In this figure, the elements having the same symbols as FIG. 1 and FIG. 4 to FIG. 6 represent the same elements and their explanations are omitted.

The semiconductor device 1*a* according to the present embodiment includes the output transistor MN1 and a current detection section 2*a*. The current detection section 2*a* further includes a current limit circuit 21, in addition to the configuration (FIG. 1 and FIG. 4 to FIG. 6) of the first embodiment. In the semiconductor device 1 in the first embodiment, the level of the output signal of the A point is used only to output the presence or absence of the overcurrent. However, in the semiconductor device 1*a* in the present embodiment, the current limit circuit 21 feeds back the output signal of the A point and controls the output current Iout of the output transistor MN1. That is, the current limit circuit 21 feeds back the level of the output signal of the A point (the presence or absence of the overcurrent) and controls the gate of the output transistor MN1 such that the output current Iout does not become the overcurrent. The current limit circuit 21 includes an N-channel transistor MN3, an N-channel transistor MN4 and an N-channel transistor MN5.

The N-channel transistor MN4 and the N-channel transistor MN5 configure an inverter circuit between the electric power source 11 (VCC) and the terminal VOUT. The inverter circuit inverts the output signal of the comparison circuit 13 (the level (voltage) of the output signal of the A point). The N-channel transistor MN3 is connected between the gate of the output transistor MN1 and the terminal VOUT. The N-channel transistor MN3 is controlled by the output signal of the inverter circuit. The comparison circuit 13, the inverter circuit (MN4 and MN5) and the N-channel transistor MN3, together with the output transistor MN1, the sense transistor MN2 and the sense resistor RS, form a feedback loop to limit the current of the output transistor MN1.

The inverter circuit includes the N-channel transistor MN4 and the N-channel transistor MN5. In the present embodiment, although the N-channel transistor MN4 is a depression type, it can be replaced with a resistor or a P-channel transistor. A source, a drain and a gate of the N-channel transistor MN4 are connected to a drain of the N-channel transistor MN5, the electric power source (VCC), and a drain of the N-channel transistor MN5, respectively. The source, the drain and the gate of the N-channel transistor MN5 are connected to the terminal VOUT, the source of the N-channel transistor MN4 and the A point, respectively. A source, a drain and a gate of the N-channel transistor MN3 are connected to the terminal VOUT, the gate of the output transistor MN1, and the output of the inverter circuit (the drain of the N-channel transistor MN5), respectively.

The operating method of the semiconductor device 1*a* of the present embodiment will be described below.

At first, a normal load case is considered. When the load is normal, similarly to the first embodiment, the output signal of the comparison circuit 13 (the voltage of the A point) is at the H level. At this time, the inverter circuit outputs the L level and supplies the L-level voltage to the gate of the N-channel transistor MN3. As a result, the N-channel transistor MN3 is made non-conductive and gate charges of the output transistor MN1 are not pulled out (the current limit circuit 21 is invalid). The output current Iout of the output transistor MN1 is kept.

Next, an abnormal load case is considered. When the load is abnormal, the output current Iout of the output transistor MN1 is increased (which leads to the overcurrent). Thus, similarly to the first embodiment, the output signal of the comparison circuit 13 (the voltage of the A point) becomes at the L level. At this time, the inverter circuit outputs the H level and supplies the H-level voltage to the gate of the N-channel transistor MN3. That is, the N-channel transistor MN3 is made conductive, and the gate charges of the output transistor MN1 are pulled out. Consequently, the output current Iout of the output transistor MN1 is decreased. When the output current Iout of the output transistor MN1 is decreased, the current Isense of the sense transistor MN2 is also decreased. As a result, the voltage Vsense of the E point is decreased. That is, the current I3 of the comparison circuit 13 is decreased, and the output signal (the voltage of the A point) becomes at the H level. When the output signal of the comparison circuit 13 (the voltage of the A point) becomes at the H level, the N-channel transistor MN3 is made non-conductive. Thus, the charges are injected into the gate of the output transistor MN1 from the gate drive circuit 10. Hence, again, the output current Iout of the output transistor MN1 is increased. As mentioned above, the feedback operation is carried out, and the output current Iout of the output transistor MN1 is limited by the current of the current detection value K1.

Even the present embodiment can provide the effect similar to the first embodiment.

Also, the present embodiment can carry out the current limit by configuring the feedback loop. Consequently, the present embodiment can continuously supplies the output current Iout while limiting the value of the output current Iout so as to avoid the output current Iout from reaching the overcurrent.

(Third Embodiment)

A configuration of a semiconductor device 1b according to the third embodiment will be described below with reference to the attached drawings.

In the semiconductor device 1b in the present embodiment, the configuration of the circuit for generating the current I2 depending on the sense current Isense (namely, the output current Iout) differs from the configuration of the semiconductor device 1a in the second embodiment. Hereafter, the difference from the second embodiment will be mainly described.

Figure 14:
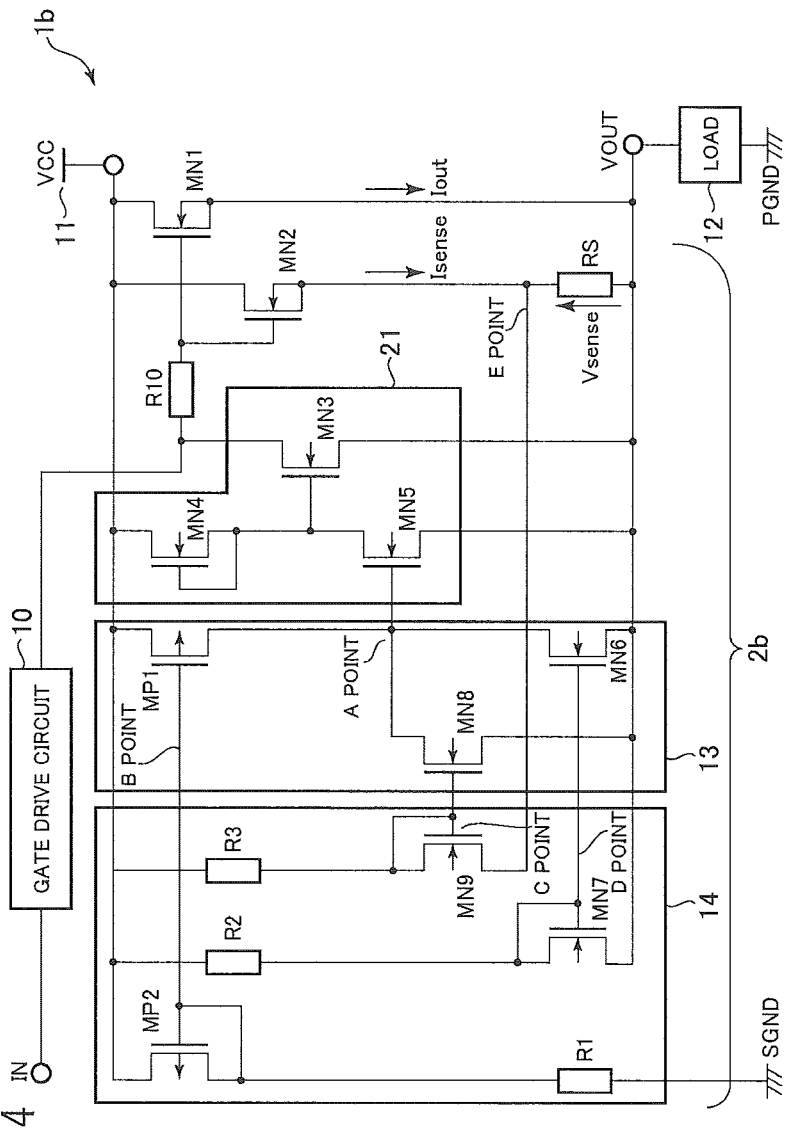
FIG. 14 is a block diagram showing a configuration example of a semiconductor device according to a third embodiment.

FIG. 14 is a block diagram showing a configuration example of the semiconductor device according to the present embodiment. In this figure, the elements having the same symbols as FIG. 13 represent the same elements, and their explanations are omitted.

The semiconductor device 1b according to the present embodiment includes the output transistor MN1 and a current detection section 2b. In the current detection section 2b, the configuration of the circuit for generating the current I2 depending on the sense current Isense differs from the configuration of the second embodiment (FIG. 13). In the second embodiment, since the voltage of the E point is received at the gate of the N-channel transistor MN8, the sense voltage Vsense must be equal to or higher than the threshold voltage of the N-channel transistor MN8. Thus, the sense voltage Vsense cannot be made small. Here, if the sense voltage Vsense can be made small, a sense ratio of the sense voltage Vsense to the output current Iout can be further improved. In short, if the sense voltage Vsense is made small, a difference between the voltage between the drain and the source of the output transistor MN1 and the voltage between the drain and the source of the sense transistor MN2, and a difference between the voltage between the gate and the source of the output transistor MN1 and the voltage between the gate and the source of the sense transistor MN2 are made small, which can improve the sense ratio. In the semiconductor device 1b in the present embodiment, an N-channel transistor MN9 and a resistor R3 are further added to the bias circuit 14. Then, the N-channel transistor MN9 and the N-channel transistor MN8 are used as a pair transistor, and the sense voltage Vsense (the voltage of the E point) is inputted to a source of the N-channel transistor MN9. Consequently, even if the E point is low voltage, the N-channel transistor MN8 can be operated. That is, the sense voltage Vsense can be made low, thereby improving the current sensing precision.

The source, the drain and the gate of the N-channel transistor MN9 are connected to the E point, one end of the resistor R3, and the drain of the N-channel transistor MN9, respectively. The source, the drain and the gate of the N-channel transistor MN8 are connected to the terminal VOUT, the A point, and the gate of the N-channel transistor MN9, respectively. The other end of the resistor R3 is connected to the electric power source 11 (VCC).

Next, with regard to the operating method of the semiconductor device 1b according to the present embodiment, the operation when the load is normal and the operation when the load is abnormal are similar to those of the second embodiment.

Even the present embodiment can provide the effect similar to the second embodiment.

Also, in the present embodiment, the N-channel transistor MN8 and the N-channel transistor MN9 configure a differential pair in which the Vsense voltage (the voltage of the E point) is inputted to the source of the N-channel transistor MN9. For this reason, even if the voltage of the E point is equal to or less than the threshold voltage of the N-channel transistor MN9, the current can be detected, and the gate of the N-channel transistor MN8 can be driven for the very small voltage change of the E point. Thus, as compared with the second embodiment, the voltage of the E point can be made very small, which improves a detection precision in a case when the sense current Isense (shortly, the output current Iout) is made small. Consequently, the current detection value can be set at a good precision. In short, in the semiconductor device 1b according to the present embodiment, the current detection range can be enlarged, as compared with the semiconductor device 1a according to the second embodiment.

Also, according to the configuration (FIG. 13) of the second embodiment, in order to generate the sense voltage Vsense of a certain value or more, the sense resistor RS is required to have a certain degree of resistance. On the contrary, according to the configuration (FIG. 14) of the present embodiment, the resistive value of the sense resistor RS can be made small (for example, ⅕ to 1/10). Here, an overcurrent detection precision is affected by the inversion precision of the A point. The inversion precision of the A point in FIG. 13 is affected by the variation in the threshold of the N-channel transistor MN8 and the variation in the resistive value of the sense resistor RS. On the contrary, the inversion precision of the A point in FIG. 14 is affected by the variation in the resistive value of the sense resistor RS. However, since the N-channel transistor MN8 and the N-channel transistor MN9 configure the differential pair, the variation in the threshold is cancelled. Thus, according to the configuration in FIG. 14, the inversion precision of the A point can be improved as compared with the configuration in FIG. 13 and the overcurrent detection precision can be improved.

(Fourth Embodiment)

A configuration of a semi conductor device 1c according to the fourth embodiment will be described below with reference to the attached drawings.

In the semiconductor device 1c in the present embodiment, the configuration of the circuit for generating the current I2 depending on the sense current Isense (namely, the output current Iout) differs from the configuration of the semiconductor device 1b in the third embodiment. Hereafter, the difference from the third embodiment will be mainly described.

Figure 15:
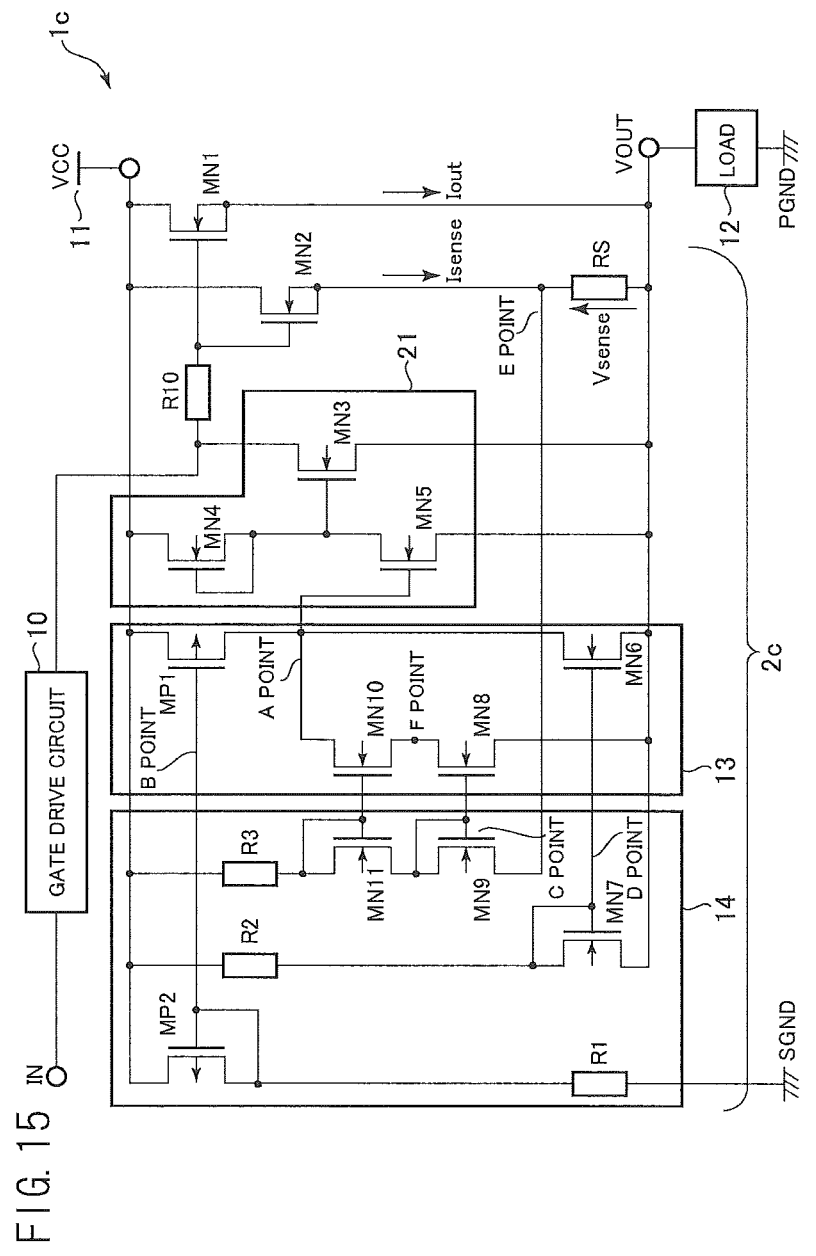

FIG. 15 is a block diagram showing a configuration example of the semiconductor device according to the present embodiment. In this figure, the elements having the same symbols as FIG. 14 represents the same elements and their explanations are omitted.

The semiconductor device 1c according to the present embodiment includes the output transistor MN1 and a current detection section 2c. In the current detection section 2c, the configuration of the circuit for generating the current I2 depending on the sense current Isense (namely, the output current Iout) differs from the configuration of the third embodiment (FIG. 14). The N-channel transistor MN8 is desired to be operated in the linear region. However, in the third embodiment, since the drain of the N-channel transistor MN8 that configures the differential pair is connected to the A point, the N-channel transistor MN8 is operated in the saturation region. However, in the semiconductor device is in the present embodiment, an N-channel transistor MN10 and an N-channel transistor MN11 are further added to the comparison circuit 13. Then, the N-channel transistor MN9 and the N-channel transistor MN11 are cascode-connected, and the N-channel transistor MN8 and the N-channel transistor MN10 are cascode-connected. Consequently, the drain (F point) of the N-channel transistor MN8 remains at a low voltage (serves as an operating point close to the linear region). That is, the drain current (current I2) of the N-channel transistor MN8 can be set to the current in which the output current Iout is more accurately reflected.

The source, the drain and the gate of the N-channel transistor MN9 are connected to the E point, the source of the N-channel transistor MN11, and the drain of the N-channel transistor MN9, respectively. The source, the drain and the gate of the N-channel transistor MN11 are connected to the drain of the N-channel transistor MN9, one end of the resistor R3, and the drain of the N-channel transistor MN11, respectively. The other end of the resistor R3 is connected to the electric power source 11 (VCC). The source, the drain and the gate of the N-channel transistor MN8 are connected to the terminal VOUT, the F point, and the gate of the N-channel transistor MN9, respectively. The source, the drain and the gate of the N-channel transistor MN10 are connected to the F point, the A point, and the gate of the N-channel transistor MN11, respectively.

Next, with regard to the operating method of the semiconductor device 1c according to the present embodiment, the operation when the load is normal and the operation when the load is abnormal are similar to those of the third embodiment.

Even the present embodiment can provide the effect similar to the third embodiment.

Also, in the present embodiment, with the cascode-connected differential pair (the N-channel transistor MN8, the N-channel transistor MN9, the N-channel transistor MN10 and the N-channel transistor MN11), the potential of the F point can be substantially fixed to a voltage of the boundary between the linear region and the saturation region. Based on the current of the output transistor MN1, the voltage of the A point is changed to the H level or the L level. However, at that time, the voltage between the drain and the source of the N-channel transistor MN10 (between the A point and the F point) is greatly changed. Consequently, the change in the output current Iout can be detected at the good precision. Thus, the output current Iout can be controlled to the current detection value K1 at the good precision.

(Fifth Embodiment)

A configuration of a semiconductor device 1d according to the fifth embodiment will be described below with reference to the attached drawings. With regard to the semiconductor device 1d in the present embodiment, a configuration in which a latching circuit 15 is added between the output of the comparison circuit 13 and the input of the current limit circuit 21 differs from the configuration of the semiconductor device 1c in the fourth embodiment. Hereafter, the difference from the fourth embodiment will be mainly described.

Figure 16:
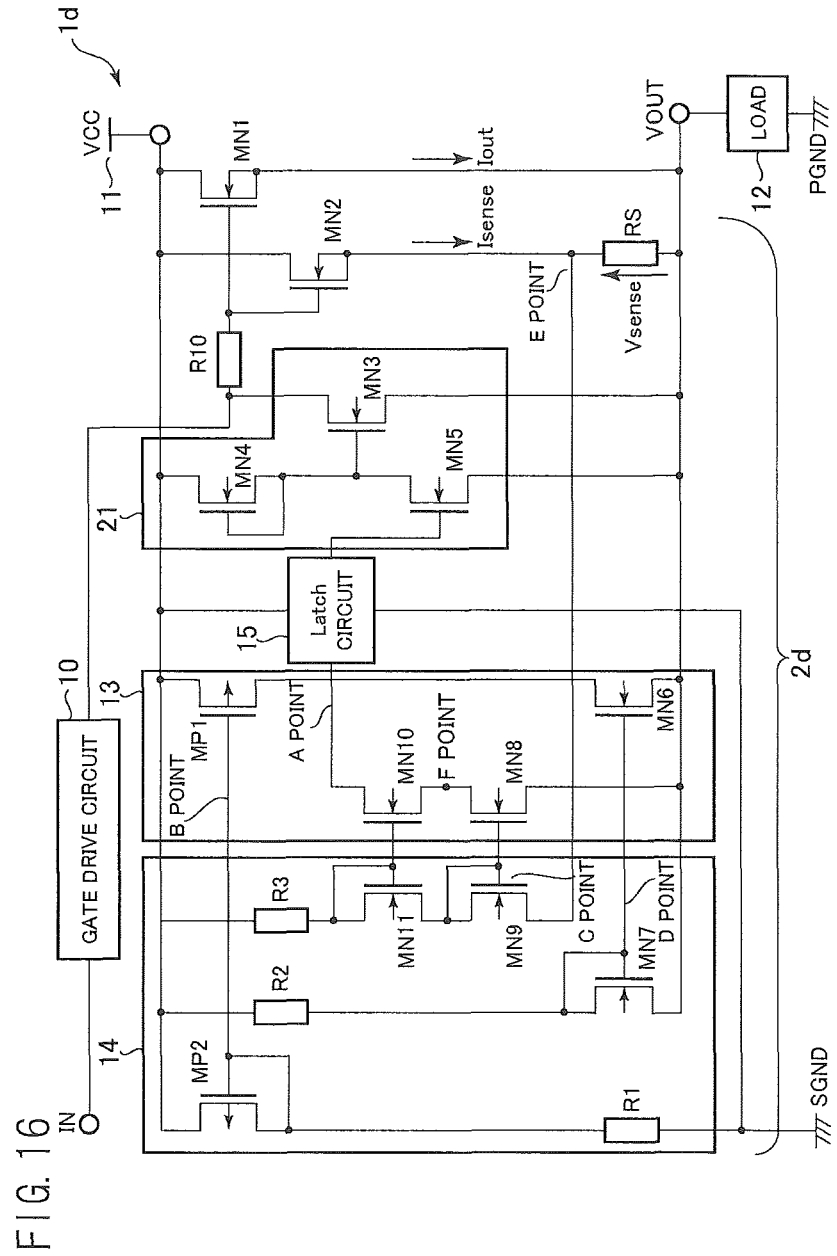
FIG. 16 is a block diagram showing a configuration example of a semiconductor device according to a fifth embodiment.

FIG. 16 is a block diagram showing a configuration example of the semiconductor device according to the present embodiment. In this figure, the elements having the same symbols as FIG. 15 represents the same elements and their explanations are omitted.

The semiconductor device 1d according to the present embodiment includes the output transistor MN1 and a current detection section 2d. With regard to the current detection section 2d, the configuration in which the latching circuit 15 is added between the output of the comparison circuit 13 and the input of the current limit circuit 21 differs from the configuration (FIG. 15) of the fourth embodiment. That is, the latching circuit 15 is arranged between the output of the comparison circuit 13 (the A point) and the input of the inverter circuit (the N-channel transistor MN4 and the N-channel transistor MN5) in the current limit circuit 21.

The latching circuit 15 is connected between the electric power source 11 (VCC) and the ground SGND, and an input of the latching circuit 15 is connected to the A point. An output of the latching circuit 15 is connected to the gate of the N-channel transistor MN5 in the inverter circuit. The latching circuit 15 outputs the H level signal when the load is normal and outputs the L level signal when the load is abnormal.

The operating method of the semiconductor device 1d according to the present embodiment will be described below.

At first, the normal load case is considered. When the load is normal, the output signal of the comparison circuit 13 (the voltage of the A point) is at the H level. The output signal of the H level is inputted to the latching circuit 15, and the H level is outputted to the output of the latching circuit 15. By the inverter circuit (the N-channel transistor MN4 and the N-channel transistor MN5), the H level is inverted to the L level, and the L level is supplied to the gate of the N-channel transistor MN3. As a result, the N-channel transistor MN3 is made non-conductive. The gate charges of the output transistor MN1 are not pulled out. The output of the latching circuit 15 is fixed to the H level, and the output current Iout of the output transistor MN1 is kept.

Next, the abnormal load case is considered. When the load is abnormal, the output current Iout of the output transistor MN1 is increased, and the output signal of the comparison circuit 13 (the voltage of the A point) becomes at the L level. The current detection signal of the L level is latched by the latching circuit 15, and the L level is outputted to the output of the latching circuit 15. Consequently, the H level signal is inputted to the gate of the N-channel transistor MN3, and the N-channel transistor MN3 is made conductive and pulls out the gate charges of the output transistor MN1. Here, in the case of the fourth embodiment, the current limit operation in which the sense current Isense (namely, the output current Iout) is limited such that the voltage of the A point satisfies the equation (1) is continued. On the other hand, in the present embodiment, which differs from it, once the output of the latching circuit 15 becomes at the L level, the output of the latching circuit 15 is fixed to the L level until the latching circuit 15 is reset. For this reason, the N-channel transistor MN3 perfectly pulls out the charges of the output transistor MN1, and the output transistor MN1 is made non-conductive. In this way, the latching circuit 15 is used to carry out the overcurrent detecting/blocking operation for shutting down the output transistor MN1 after the overcurrent detection.

Even the present embodiment can provide the effect similar to the fourth embodiment.

In addition, when the overcurrent is detected at the time of the load abnormality, the method of blocking the overcurrent can be used to protect the output transistor MN1. The current limit circuit 21 and the latching circuit 15 can be regarded as a current blocking section for blocking the current of the output transistor MN1.

(Sixth Embodiment)

A configuration of a semiconductor device 1e according to the sixth embodiment will be described below with reference to the attached drawings. The semiconductor device 1e in the present embodiment differs from the semiconductor device 1 in the first embodiment in that the semiconductor device 1e is used as a low side switch. Hereafter, the difference from the first embodiment will be mainly described.

Figure 17:
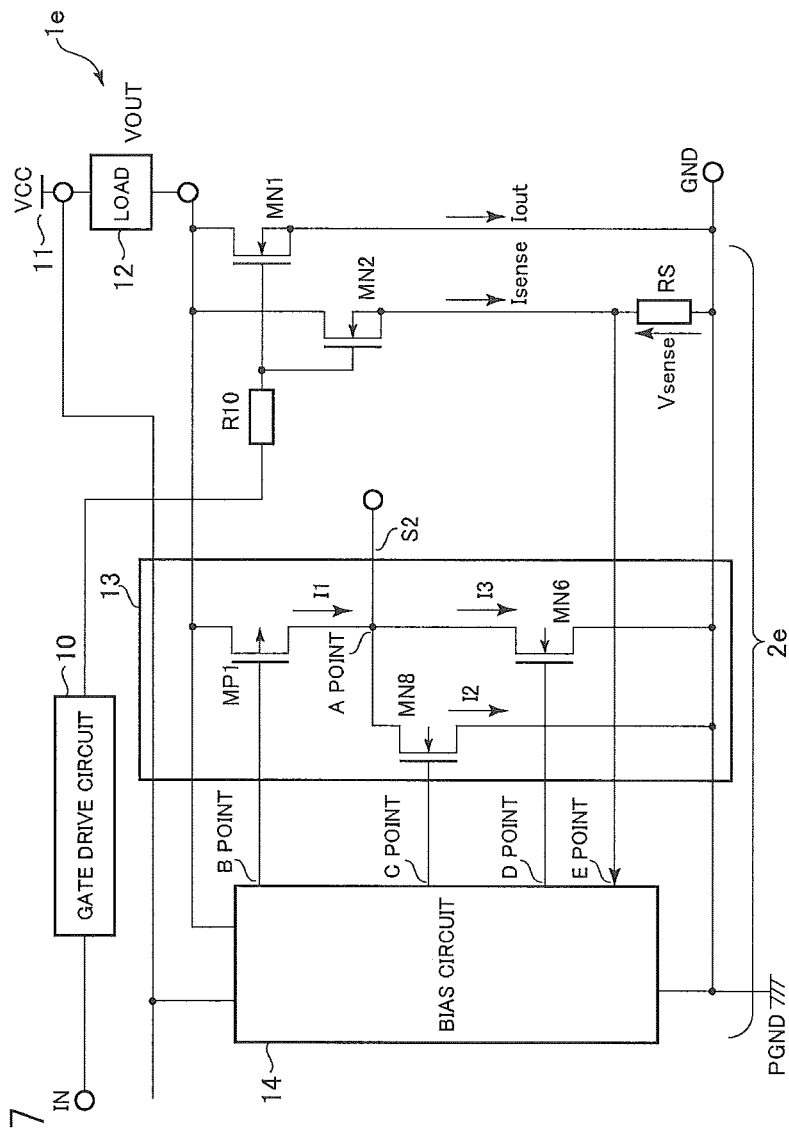
FIG. 17 is a block diagram showing a configuration example of a semiconductor device according to a sixth embodiment.

FIG. 17 is a block diagram showing a configuration example of the semiconductor device according to the present embodiment. This figure shows the example when the semiconductor device 1e is installed as the low side switch. In this low side switch configuration, the source and the drain of the output transistor MN1 are connected to a GND terminal and a VOUT terminal, respectively. Also, the source and the drain of the sense transistor MN2 in the current detection section 2e are connected to one end of the sense resistor RS and the VOUT terminal, respectively. The other end of the sense resistor RS is connected to the GND terminal. The GND terminal is connected to the PGND. The VOUT terminal is connected through the load 12 to the electric power source 11 (VCC). In the present embodiment, the GND of the bias circuit 14 is also connected to the PGND. However, the GND of the bias circuit 14 may be connected to the SGND.

Figure 18:
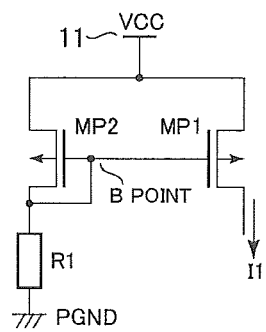
FIG. 18 is a circuit diagram showing an example of a configuration of a bias circuit and a comparison circuit of the semiconductor device according to the embodiment.
Figure 19:
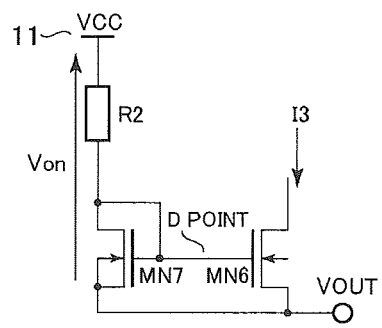
FIG. 19 is a circuit diagram showing an example of a configuration of a bias circuit and a comparison circuit of the semiconductor device according to the embodiment.
Figure 20:
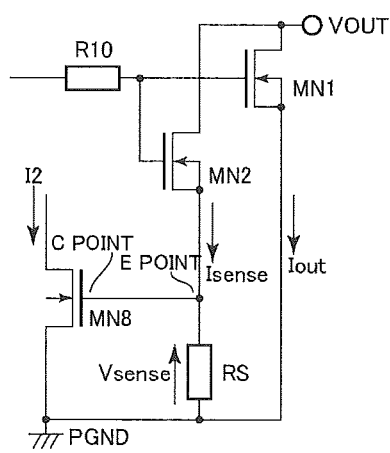
FIG. 20 is a circuit diagram showing an example of a configuration of a bias circuit and a comparison circuit of the semiconductor device according to the embodiment.

FIG. 18 to FIG. 20 are circuit diagrams showing examples of configurations of the bias circuit 14 and the comparison circuit 13 in the semiconductor device according to the present embodiment. Here, FIG. 18 shows an example of a circuit configuration for generating the current I1 depending on the electric power source voltage VCC. FIG. 19 shows an example of a circuit configuration for generating the current I3 depending on the Von. FIG. 20 shows an example of a circuit configuration for generating the current I2 depending on the output current Iout in the output transistor MN1.

Although the circuit configuration of FIG. 18 is basically equal to the configuration of FIG. 4, the other end of the resistor R1 is connected to the PGND. However, the other end of the resistor R1 may be connected to the SGND. Although the circuit configuration of FIG. 19 is equal to the circuit configuration of FIG. 5, the resistor R2 and the N-channel transistor MN7 are connected in series between the terminal VOUT and the PGND. The source of the N-channel transistor MN6 is connected to the PGND. However, the source of the N-channel transistor MN6 may be connected to the SGND. Although the circuit configuration of FIG. 20 is basically equal to the circuit configuration of FIG. 6, the source of the output transistor MN1, the other end of the sense resistor RS and the source of the N-channel transistor MN8 are connected to the PGND. However, they may be connected to the SGND. Also, the drains of the output transistor MN1 and the sense transistor MN2 are connected to the terminal VOUT.

Next, the operating method of the semiconductor device 1e according to the present embodiment is similar to that of the first embodiment.

Even the present embodiment can provide the effect similar to the first embodiment.

(Seventh Embodiment)

A configuration of a semiconductor device 1f according to the seventh embodiment will be described below with reference to the attached drawings. The semiconductor device 1f in the present embodiment differs from the semiconductor device 1e in the sixth embodiment in the connecting method of the sense resistor RS. Hereafter, the difference from the sixth embodiment will be mainly described.

Figure 21:
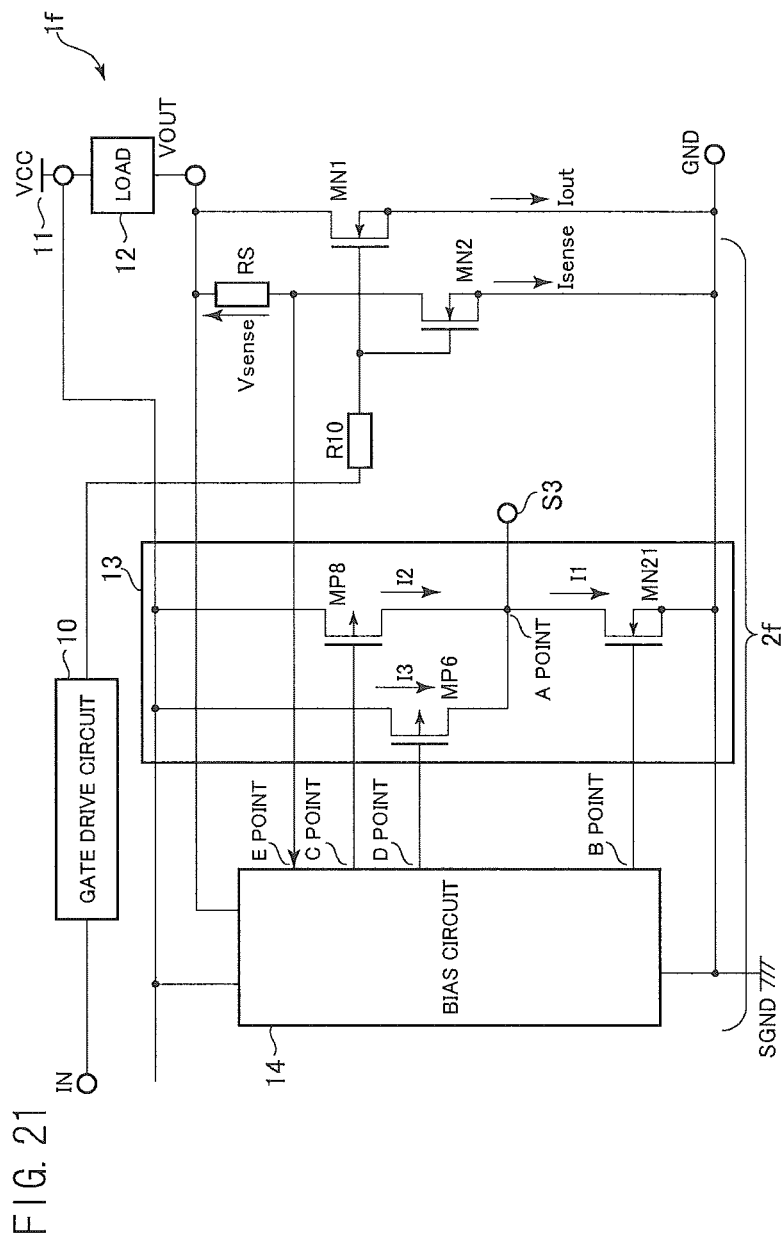
FIG. 21 is a block diagram showing a configuration example of a semiconductor device according to a seventh embodiment.

FIG. 21 is a block diagram showing a configuration example of the semiconductor device according to the present embodiment. This semiconductor device 1f, although serving as the low side switch, has a configuration in which a high side configuration (the semiconductor device 1 in the first embodiment (FIG. 1)) is made opposite. As compared with the first embodiment, the connecting method of the sense resistor RS in the current detection section 2f is different. The source and the drain of the output transistor are connected to the GND terminal and the VOUT terminal, respectively. The source and the drain of the sense transistor are connected to the GND terminal and one end of the sense resistor RS, respectively. The other end of the sense resistor RS is connected to the VOUT terminal. The GND terminal is connected to the PGND. The VOUT terminal is connected through the load 12 to the electric power source 11.

The comparison circuit 13 detects whether or not the current flowing through the output transistor MN1 is the overcurrent. The comparison circuit 13 includes an N-channel transistor MN21, a P-channel transistor MP8 and a P-channel transistor MP6. The signal of the B point of the bias circuit 14 is supplied to the gate of the N-channel transistor MN21. The signal of the C point of the bias circuit 14 is supplied to the gate of the P-channel transistor MP8. The signal of the D point of the bias circuit 14 is supplied to the gate of the P-channel transistor MP6. The N-channel transistor MN21 is connected between the PGND and the A point. The P-channel transistors MP8 and MP6 are connected between the A point and the electric power source 11 (VCC), in parallel to each other.

Figure 22:
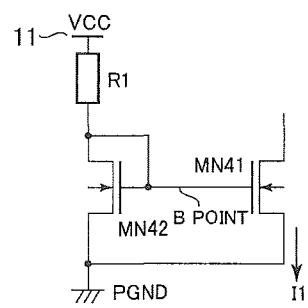
FIG. 22 is a circuit diagram showing an example of a configuration of a bias circuit and a comparison circuit of the semiconductor device according to the embodiment.
Figure 23:
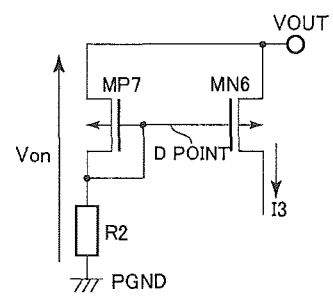
FIG. 23 is a circuit diagram showing an example of a configuration of a bias circuit and a comparison circuit of the semiconductor device according to the embodiment.
Figure 24:
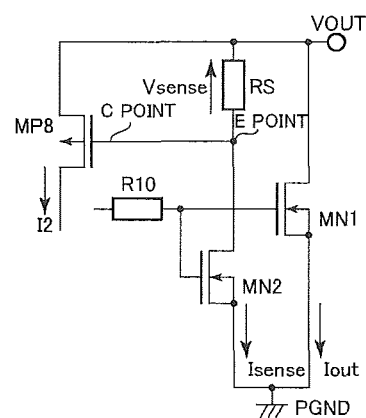
FIG. 24 is a circuit diagram showing an example of a configuration of a bias circuit and a comparison circuit of the semiconductor device according to the embodiment.

FIG. 22 to FIG. 24 are circuit diagrams showing examples of configurations of the bias circuit 14 and the comparison circuit 13 in the semiconductor device according to the present embodiment. Here, FIG. 22 shows an example of a circuit configuration for generating the current I1 depending on the electric power source voltage VCC. FIG. 23 shows an example of a circuit configuration for generating the current I3 depending on the Von. FIG. 24 shows an example of a circuit configuration for generating the current I2 depending on the sense current Isense (namely, 1/n of the output current Iout of the output transistor MN 1).

In FIG. 22, an N-channel transistor MN41 and an N-channel transistor MN42 are connected in the current mirror manner. Then, the gate and the drain of the N-channel transistor MN42 are connected through the resistor R1 to the electric power source 11 (VCC). Specifically, the sources of the N-channel transistor MN41 and the N-channel transistor MN42 are connected to the PGND. The gates of the N-channel transistor MN41 and the N-channel transistor MN42 are connected to the drain of the N-channel transistor MN42. The drain of the N-channel transistor MN42 is connected to one end of the resistor R1. The other end of the resistor R1 is connected to the electric power source 11 (VCC). Similarly to the circuit in FIG. 4, the circuit in FIG. 22 can pull out the current I1 depending on the electric power source voltage VCC from the A point. The current I1 becomes the current proportional to the electric power source voltage VCC.

In FIG. 23, the P-channel transistor MP6 and the P-channel transistor MP7 are connected in the current mirror manner. Then, the gate and the drain of the P-channel transistor MP7 are connected through the resistor R2 to the PGND. Specifically, the sources of the P-channel transistor MP6 and the P-channel transistor MP7 are connected to the terminal VOUT. The gates of the P-channel transistor MP6 and the P-channel transistor MP7 are connected to the drain of the P-channel transistor MP7. The drain of the P-channel transistor MP7 is connected to one end of the resistor R2. The other end of the resistor R2 is connected to the PGND. Similarly to the circuit in FIG. 5, the circuit in FIG. 23 can supply the current I3 depending on the Von (=the voltage between the terminal VOUT and the (P) GND) into the A point. The current I3 becomes the current proportional to the Von.

In FIG. 24, the sources of the output transistor MN1 and the sense transistor MN2 are commonly connected to the PGND. The gates of the output transistor MN1 and the sense transistor MN2 are commonly connected. The drain of the output transistor MN1 is connected to the terminal VOUT. The drain of the sense transistor MN2 is connected to one end (the E point) of the sense resistor RS. The other end of the sense resistor RS is connected to the terminal VOUT. In the P-channel transistor MP8, the source is connected to the terminal VOUT, and the gate is connected to the E point. Similarly to the circuit in FIG. 6, the circuit in FIG. 24 can supply the current I2 depending on the output current Iout (namely, the Isense) into the A point.

Incidentally, the SGND may be used instead of the PGND.

Next, the operating method of the semiconductor device 1f according to the present embodiment is similar to that of the sixth embodiment.

Even the present embodiment can provide the effect similar to the sixth embodiment.

Also, as compared with the seventh embodiment, since the voltage between the gate and the source of the output transistor MN1 is equal to the voltage between the gate and the source of the sense transistor MN2, the sense precision of the output current Iout is improved.

(Eighth Embodiment)

An electronic control system according to the eighth embodiment will be described with reference to the attached drawings. The present embodiment will be described for a case that the semiconductor devices 1 and 1a to 1f of the above respective embodiments are applied to the electronic control system.

Figure 25:
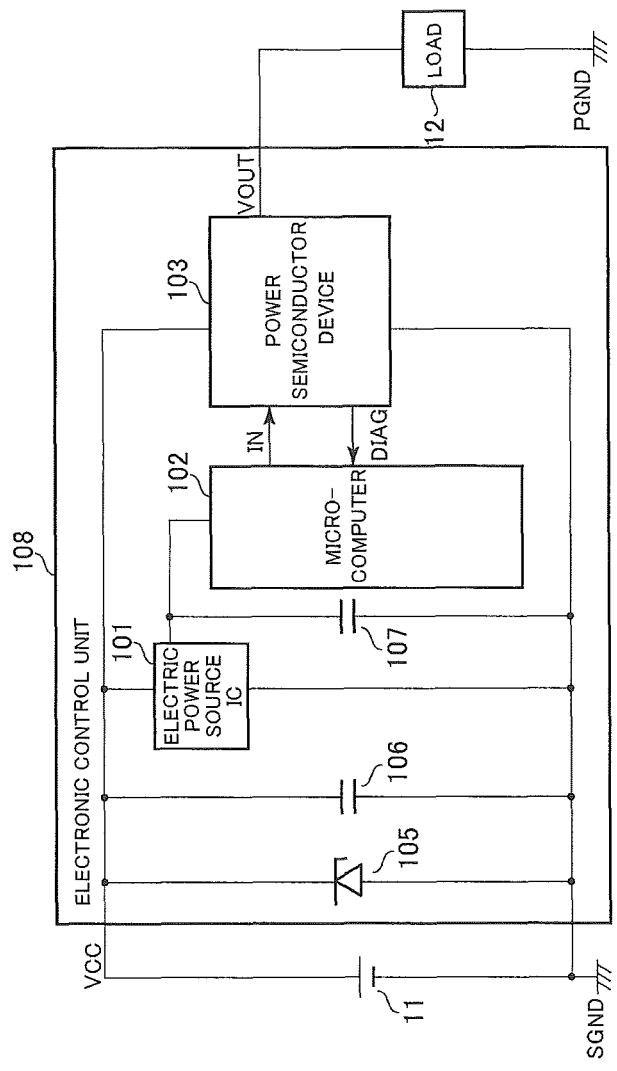
FIG. 25 is a block diagram showing an example of a configuration of an electronic control system according to an eighth embodiment.

FIG. 25 is a block diagram showing an example of a configuration of the electronic control system according to the present embodiment. This figure shows an example in which the semiconductor device of each above embodiment is used as a power semiconductor device 103 in an electronic control system of a car. This figure shows an example in which the power semiconductor device 103 is applied to a high side (corresponding to the first to fifth embodiments). However, the present embodiment is not limited to this example. The power semiconductor device 103 may be applied to a low side (corresponding to the sixth and seventh embodiments).

The electronic control system includes an electronic control unit 108, a battery electric power source 11 and the load 12. The electronic control unit 108 includes the power semiconductor device 103, an electric power source IC 101, a microcomputer 102, capacitors 106 and 107 and a Zener diode 105.

The battery electric power source 11 supplies the electric power source voltage VCC to the electric power source IC 101 and the power semiconductor device 103 in the electronic control unit 108. The electric power source IC 101 generates a stable voltage from the electric power source voltage VCC of the battery electric power source 11 and supplies as the electric power source voltage to the microcomputer 102. The capacitor 107 for stabilization is connected between the output terminal of the electric power source IC 101 and the GND terminal. The load 12 is connected to the output terminal VOUT of the power semiconductor device 103. The microcomputer 102 outputs an input signal IN to the power semiconductor device 103 and controls to turn on/off the power semiconductor device 103. Also, the microcomputer 102 receives a DIAG signal, which indicates a state of the power semiconductor device 103, from the power semiconductor device 103 and monitors the state of the power semiconductor device 103. The power semiconductor device 103 controls the electric power supply to the load 12 based on the input signal IN. Also, the power semiconductor device 103 feeds back the state of the power semiconductor device 103 as the DIAG signal to the microcomputer 102. The capacitor 106 for stabilization and the Zener diode 105 are connected between the terminal of the electric power source voltage VCC and the GND terminal.

When a covering of a harness connecting the load is stripped and the harness is brought into contact with the body (GND) of the car, the load short circuit occurs, in which excessive electric power is applied to the output transistor MN1 (that is not shown) in the power semiconductor device 103. In such a situation, in order to avoid the power semiconductor device 103 from being broken, a function for preventing the overcurrent is installed inside the power semiconductor device 103. As for the power semiconductor device 103, the semiconductor devices 1 and 1a to 1d of the above-mentioned embodiments can be used for the case of the high side, and the semiconductor devices 1e and 1f can be used for the case of the low side.

Figure 26:
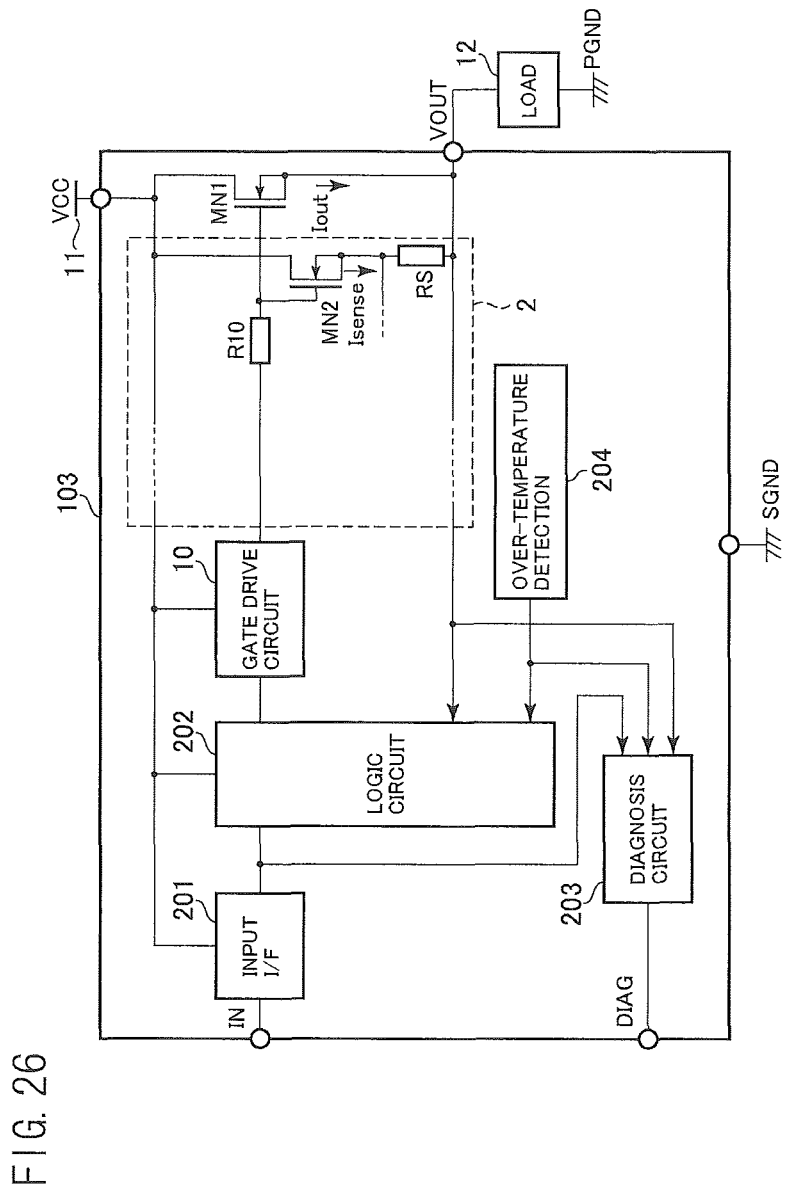
FIG. 26 is a block diagram showing an example of a configuration of a power semiconductor device according to the eighth embodiment.

FIG. 26 is a block diagram showing an example of a configuration of the power semiconductor device 103 according to the present embodiment. This figure shows an example in which the power semiconductor device 103 is applied to the high side. In that case, the power semiconductor device 103 is, for example, the semiconductor devices 1 and 1a to 1d of the above respective embodiments. However, the present embodiment is not limited to those examples. The power semiconductor device 103 may be applied to the low side. In that case, the power semiconductor device 103 is, for example, the semiconductor devices 1e and 1f in the above respective embodiments. Hereafter, the case of the semiconductor device 1 will be representatively described.

In FIG. 26, the power semiconductor device 103 (semiconductor device 1) includes an input I/F 201, a logic circuit 202, a diagnosis circuit 203, an over-temperature detector 204, the gate drive circuit 10, the output transistor MN1 and the current detection section 2.

The input I/F 201 supplies the input signal IN to the logic circuit 202. The logic circuit 202 controls to turn on/off the output transistor MN1, by using the gate drive circuit 10, based on the input signal IN. Also, the logic circuit 202 controls the gate voltage of the output transistor MN1, by using the gate drive circuit 10, based on the output signal from the current detection section 2 or over-temperature detector 204. The output signal from the current detection section 2 is exemplified as a signal (e.g. the voltage of the A point) which indicates the occurrence of the overcurrent (the load short circuit). The output signal from the over-temperature detector 204 is exemplified as a signal which indicates the presence or absence of the overheat of the output transistor MN1. The over-temperature detector 204 measures a temperature of the output transistor MN1 and outputs a signal which indicates the temperature or whether the overheat state occurs or not. The gate drive circuit 10 controls the gate of the output transistor MN1 in response to the control signal from the logic circuit 202. The current detection section 2 and the output transistor MN1 are as described in the above respective embodiments and have the function for preventing the overcurrent. The diagnosis circuit 203 outputs the DIAG signal which indicates the state of the output transistor MN1 or the state of the power semiconductor device 103, based on the output signal from the current detection section 2 or over-temperature detector 204.

When the load short circuit occurs, the protection circuit (e.g. the current detection section 2) of the power semiconductor device 103 is operated to carry out the operation of the current limit (or the overcurrent detection shutdown) so that the output transistor MN1 is not broken. Simultaneously with the operation, the power semiconductor device 103 outputs the DIAG signal, which indicates the occurrence of the load abnormality, to the microcomputer 102. The microcomputer 102 carries out various calculations in response to the DIAG signal of the power semiconductor device 103 and controls the power semiconductor device 103 so that the electronic control unit is safely operated.

Figure 27:
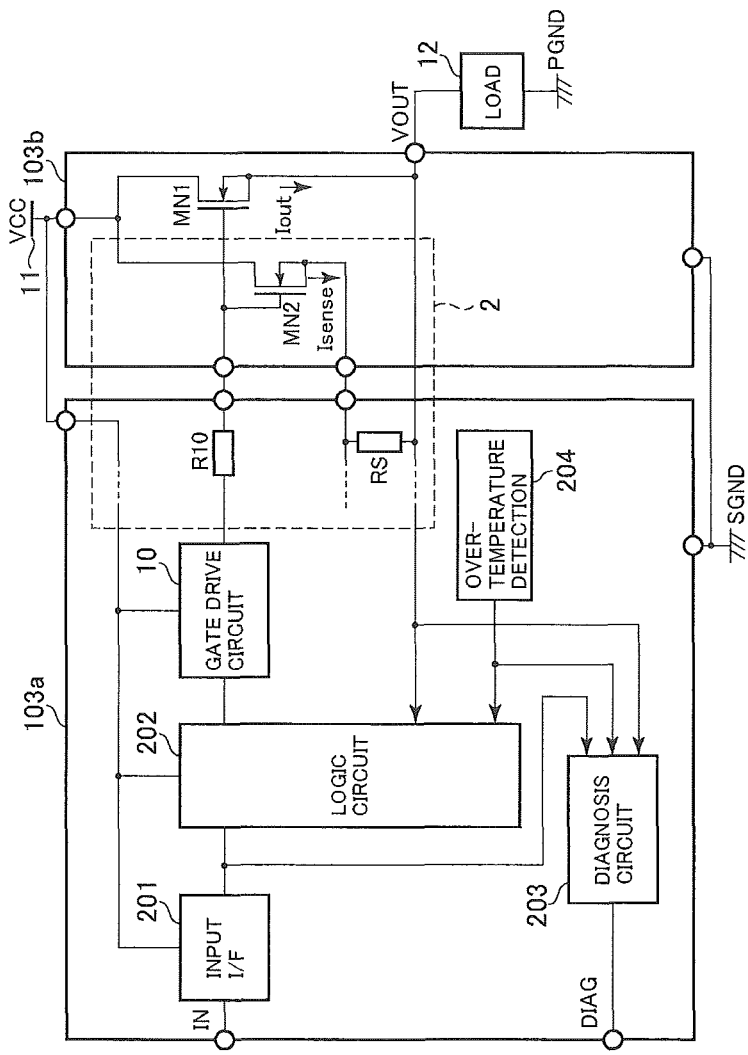
FIG. 27 is a block diagram showing another example of a configuration of the power semiconductor device according to the eighth embodiment.

In the present embodiment, the power semiconductor device 103 is configured as one chip. Consequently, it is possible to easily carry out the installation and wiring of the power semiconductor device 103 into the electronic control unit 108. However, the present embodiment is not limited to this example. A part or all of the input I/F 201, the logic circuit 202, the diagnosis circuit 203, the over-temperature detector 204, the gate drive circuit 10, the output transistor MN1 and the current detection section 2 may be configured as different chips. For example, the output transistor MN1 and the sense transistor MN2 in the current detection section 2 may be configured as one chip, and the remaining configuration may be configured as another chip. FIG. 27 shows that case.

FIG. 27 is a block diagram showing another example of a configuration of the power semiconductor device 103 according to the present embodiment. In the example of this figure, with regard to the power semiconductor device 103, apart of the configuration is configured as a different chip. In particular, the output transistor MN1 and the sense transistor MN2 of the current detection section 2 are configured as a chip 103b, and the remaining configuration is configured as a different chip 103a.

Even the present embodiment can provide the effect similar to the first to seventh embodiments.

Incidentally, in the above respective embodiments, under the condition that the output transistor MN1 and the sense transistor MN2 are N-channel transistors, the semiconductor devices 1 and 1a to 1f are configured. However, the respective embodiments are not limited to the above example. That is, even if the output transistor MN1 and the sense transistor MN2 are P-channel transistors, the semiconductor devices 1 and 1a to 1f may be configured.

Also, in the above respective embodiments, under the condition that the output transistor MN1 and the sense transistor MN2 are field-effect transistors, the semiconductor devices 1 and 1a to 1f are configured. However, the respective embodiments are not limited to the above example. That is, even if the output transistor MN1 and the sense transistor MN2 are I=(Insulated Gate Bipolar Transistor), the semiconductor devices 1 and 1a to 1f may be configured. In that case, the remaining transistors may be bipolar transistors.

Also, in the above-mentioned first to sixth embodiments, the drains of the output transistor MN1 and the sense transistor MN2 are common. Consequently, when the output transistor MN1 and the sense transistor MN2 are formed on one semiconductor substrate, they can be manufactured not only as a vertical type transistor but also as a lateral type transistor.

Although the present invention invented by the present inventors has been described above in connection with several embodiments thereof, it is apparent that the present invention is not limited to the above embodiments, but may be modified and changed without departing from the scope and spirit of the invention. In addition, various techniques described in each embodiment can be similarly applied to other embodiments unless any technical contradiction occurs.

What is claimed is:

1. A semiconductor device comprising:
    an output transistor configured to control electric power supply from an electric power source, as connectable at a power source input terminal of the semiconductor device, to a load, as connectable at a power output terminal of the semiconductor device; and
    a current detection section configured to detect a current flowing through the output transistor,
    wherein the current detection section has a current detection characteristic in which a current detection value has approximately linear and negative dependence on a drain-source voltage of the output transistor, and
    wherein the current detection section comprises first, second, and third transistors, with the first and second transistors serially interconnected between the power source input terminal and the power output terminal and the third transistor interconnected in parallel with the second transistor.

2. The semiconductor device according to claim 1, wherein the current detection characteristic is that the current detection value has electric power source voltage dependence.

3. The semiconductor device according to claim 1, wherein the current detection section includes:
    a comparison circuit configured to compare a current depending on an electric power source voltage of the electric power source with a current depending on a drain-source voltage of the output transistor and a current depending on a current of the output transistor to detect the current flowing through the output transistor.

4. The semiconductor device according to claim 1, wherein the current detection section includes:
    a current limit section configured to limit, when an overcurrent equal to or more than a reference current flows through the output transistor, the current flowing through the output transistor based on a current detection value of the overcurrent.

5. The semiconductor device according to claim 1, wherein the current detection section includes:
    a current blocking section configured to block, when an overcurrent equal to or more than a reference current flows through the output transistor, a current flowing through the output transistor based on a current detection value of the overcurrent.

6. The semiconductor device according to claim 1, wherein the current detection characteristic is approximately along a maximum load line of load lines in which a load can be normally driven.

7. The semiconductor device according to claim 6, wherein the current detection characteristic is that the load line is extended to at least a liner region of the output transistor.

8. The semiconductor device according to claim 1, wherein the output transistor and the current detection section are formed in one chip.

9. The semiconductor device according to claim 1, wherein the load is connected to one of a source and a drain of the output transistor.

10. A method of operating a semiconductor device comprising:
   comparing a current depending on a drain-source voltage of an output transistor which controls electric power supply from an electric power source to a load and a current depending on a current of the output transistor with a current depending on an electric power source voltage of the electric power source to detect a current flowing through the output transistor; and
   limiting or blocking, when an overcurrent equal to or more than a reference current flows through the output transistor, a current flowing through the output transistor based on a current detection value of the overcurrent,
   wherein a current detection section comprises first, second, and third transistors, with the first and second transistors serially interconnected between a power source input terminal of the semiconductor device and a power output terminal of the semiconductor device and the third transistor interconnected in parallel with the second transistor.

* * * * *